(12) United States Patent
Wu et al.

(10) Patent No.: US 11,756,872 B2
(45) Date of Patent: Sep. 12, 2023

(54) PACKAGE STRUCTURE AND MANUFACTURING METHOD THEREOF

(71) Applicant: Taiwan Semiconductor Manufacturing Company, Ltd., Hsinchu (TW)

(72) Inventors: Sung-Yueh Wu, Chiayi County (TW); Chien-Ling Hwang, Hsinchu (TW); Jen-Chun Liao, Taipei (TW); Ching-Hua Hsieh, Hsinchu (TW); Pei-Hsuan Lee, Tainan (TW); Chia-Hung Liu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 2 days.

(21) Appl. No.: 17/199,348

(22) Filed: Mar. 11, 2021

(65) Prior Publication Data

US 2022/0293505 A1    Sep. 15, 2022

(51) Int. Cl.
| | |
|---|---|
| *H01L 23/495* | (2006.01) |
| *H01L 23/498* | (2006.01) |
| *H01L 23/31* | (2006.01) |
| *H01L 21/48* | (2006.01) |
| *H01L 23/00* | (2006.01) |

(52) U.S. Cl.
CPC ...... *H01L 23/49827* (2013.01); *H01L 21/486* (2013.01); *H01L 21/4857* (2013.01); *H01L 23/3128* (2013.01); *H01L 23/49822* (2013.01); *H01L 23/49833* (2013.01); *H01L 24/16* (2013.01); *H01L 24/32* (2013.01); *H01L 24/73* (2013.01); *H01L 2224/16225* (2013.01); *H01L 2224/32225* (2013.01); *H01L 2224/73253* (2013.01)

(58) Field of Classification Search
CPC .......... H01L 23/49827; H01L 21/4857; H01L 21/486; H01L 23/3128; H01L 23/49822; H01L 23/49833; H01L 24/16; H01L 24/32; H01L 24/73; H01L 2224/16225; H01L 2224/32225; H01L 2224/73253; H01L 23/49816; H01L 23/5389; H01L 21/6835; H01L 23/49838; H01L 23/3107
USPC ....................................................... 257/668
See application file for complete search history.

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |

(Continued)

*Primary Examiner* — Theresa T Doan
(74) *Attorney, Agent, or Firm* — JCIPRNET

(57) ABSTRACT

A package structure includes a carrier substrate, a die, and a first redistribution structure. The carrier substrate has a first surface and a second surface opposite to the first surface. The carrier substrate includes an insulating body and through carrier vias (TCV) embedded in the insulating body. The die is disposed over the firs surface of the carrier substrate. The die is electrically connected to the TCVs. The first redistribution structure is disposed on the second surface of the carrier substrate.

20 Claims, 32 Drawing Sheets

(56) References Cited

U.S. PATENT DOCUMENTS

| | | |
|---|---|---|
| 9,496,189 B2 | 11/2016 | Yu et al. |
| 2015/0156880 A1* | 6/2015 | Daizo .................. B23K 26/364 |
| | | 174/251 |
| 2017/0033083 A1* | 2/2017 | Lin .................... H01L 23/49827 |
| 2020/0344551 A1* | 10/2020 | Chen ..................... H01F 7/0289 |

* cited by examiner

US 11,756,872 B2

PACKAGE STRUCTURE AND MANUFACTURING METHOD THEREOF

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for miniaturization, higher speed and greater bandwidth, as well as stronger thermal spreading capability has grown recently. Therefore, there has grown a need for smaller and more creative packaging techniques of semiconductor dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
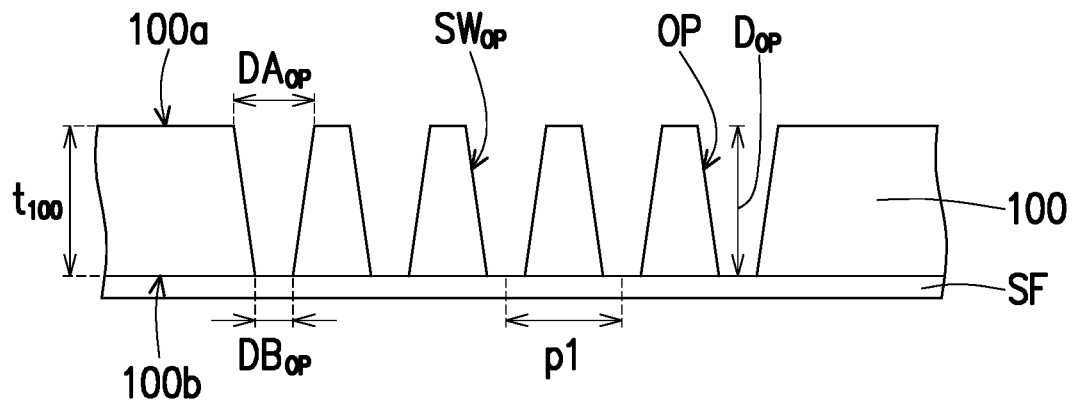
FIG. 1A to FIG. 1E are schematic cross-sectional views illustrating a manufacturing process of a carrier substrate in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1E are schematic cross-sectional views illustrating a manufacturing process of a carrier substrate C1 in accordance with some embodiments of the disclosure. Referring to FIG. 1A, an insulating body 100 is provided on a sacrificial film SF. In some embodiments, the sacrificial film SF is made of organic materials. For example, the sacrificial film SF is made of polymeric materials, such as acetal, acrylic, cellulose, acetate, polyethylene, polystyrene, vinyl, nylon, polyolefin, polyester, silicone, paraffin, or a combination thereof. In some embodiments, the insulating body 100 is made of a dielectric material. For example, the insulating body 100 is made of inorganic materials such as ceramics or glass. In some embodiments, the insulating body 100 is made of aluminum nitride (AlN), aluminum oxide ($Al_2O_3$), silicon nitride ($Si_3N_4$), silicon carbide (SiC), or the like. In some embodiments the insulating body 100 is free of fillers. In some embodiments, the insulating body 100 is an electrically insulating body. In other words, the insulating body 100 is not electrically conductive. In some embodiments, the insulating body 100 is not thermal insulating. In other words, the insulating body 100 is thermally conductive. In some embodiments, a Young's modulus of the insulating body 100 ranges from about 50 GPa to about 700 GPa. For example, when the insulating body 100 is made of AlN, $Al_2O_3$, $Si_3N_4$, SiC, or glass, the Young's modulus of the insulating body 100 is respectively about 302 GPa to about 348 GPa, about 344 GPa to about 408 GPa, about 166 GPa to about 297 GPa, about 401 GPa to about 700 GPa, or about 50 GPa to about 90GPa. In some embodiments, a hardness of the insulating body 100 ranges from about 5 Moh's to about 10 Moh's. In some embodiments, a thermal expansion coefficient (CTE) of the insulating body 100 ranges from about 2.6 ppm/° C. to about 9.7 ppm/° C. In some embodiments, a thermal conductivity of the insulating body 100 ranges from about 0.96 W/m·K to about 350 W/m·K. In some embodiments, the insulating body 100 has a thickness $t_{100}$ ranging from about 50 µm to about 1000 µm. In some embodiments, the insulating body 100 has a first surface 100a and a second surface 100b opposite to the first surface 100a. As illustrated in FIG. 1A, the sacrificial film SF is attached to the second surface 100b of the insulating body 100.

In some embodiments, the insulating body 100 has a plurality of openings OP formed therein. The openings OP may be formed by, for example, laser drilling, mechanical drilling, etching, or the like. As illustrated in FIG. 1A, each opening OP extends from the first surface 100a of the insulating body 100 to the second surface 100b of the insulating body 100. That is, each opening OP penetrates through the insulating body 100. For example, a depth $D_{OP}$ of each opening OP is substantially equal to the thickness $t_{100}$ of the insulating body 100. In some embodiments, a depth $D_{OP}$ of each opening OP ranges from about 50 µm to about 1000 µm. In some embodiments, the openings OP partially expose the sacrificial film SF. In some embodiments, each opening OP has a slanted sidewall $SW_{OP}$. That is, a first diameter $DA_{OP}$ of each opening OP at the first surface 100a of the insulting body 100 is different from a second diameter $DB_{OP}$ of each opening OP at the second surface 100b. For example, as illustrated in FIG. 1A, the first diameter $DA_{OP}$ of each opening OP is larger than a second diameter $DB_{OP}$ of each opening OP. That is, each opening OP may be in the form of a conical frustum. However, the disclosure is not limited thereto. In some alternative embodiments, each opening OP may have a substantially straight sidewall $SW_{OP}$. That is, the first diameter $DA_{OP}$ of each opening OP may be substantially equal to the second diameter $DB_{OP}$ of each opening OP, and each opening OP may be in the form of a cylinder. In some embodiments, the first diameter $DA_{OP}$ ranges from about 20 µm to about 500 µm and the second diameter $DB_{OP}$ ranges from about 5 µm to about 500 µm. In some embodiments, two adjacent openings OP2 are formed to have a pitch p1 ranging from about 100 µm to about 1000 µm. It should be noted that throughout the entire disclosure, a pitch of two adjacent elements denotes a distance between centers of these two adjacent elements.

Figure 1B:
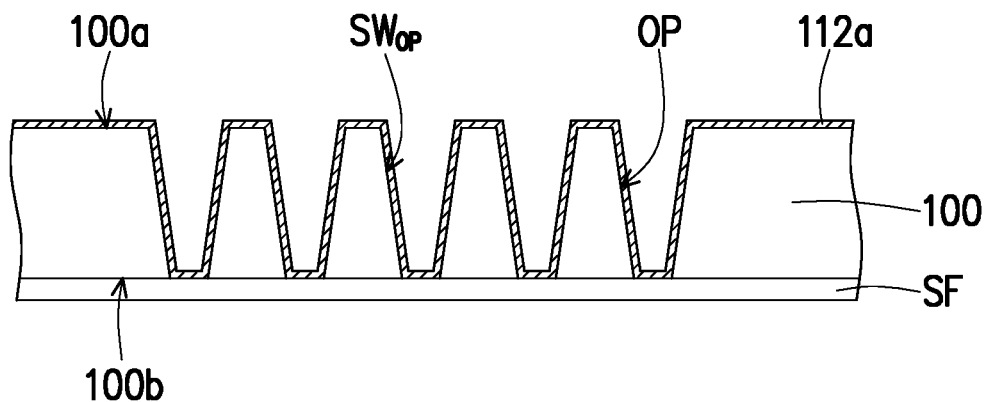

Referring to FIG. 1B, a seed material layer 112a is conformally formed on the insulating body 100. In other words, the seed material layer 112a is formed over the insulating body 100 and within the openings OP. For example, the seed material layer 112a covers the first surface 100a of the insulating body 100 and extends into the openings OP to cover sidewalls $SW_{OP}$ of the openings OP. In some embodiments, the seed material layer 112a also covers the exposed portion of the sacrificial film SF. As illustrated in FIG. 1B, the seed material layer 112a is in physical contact with the insulating body 100. The seed material layer 112a may be formed through a sputtering process, a physical vapor deposition (PVD) process, or the like. In some embodiments, the seed material layer 112a is constituted by two sub-layers (not shown). The first sub-layer may include titanium, titanium nitride, tantalum, tantalum nitride, other suitable materials, or a combination thereof. On the other hand, the second sub-layer may include copper, copper alloys, or other suitable choice of materials.

Figure 1C:
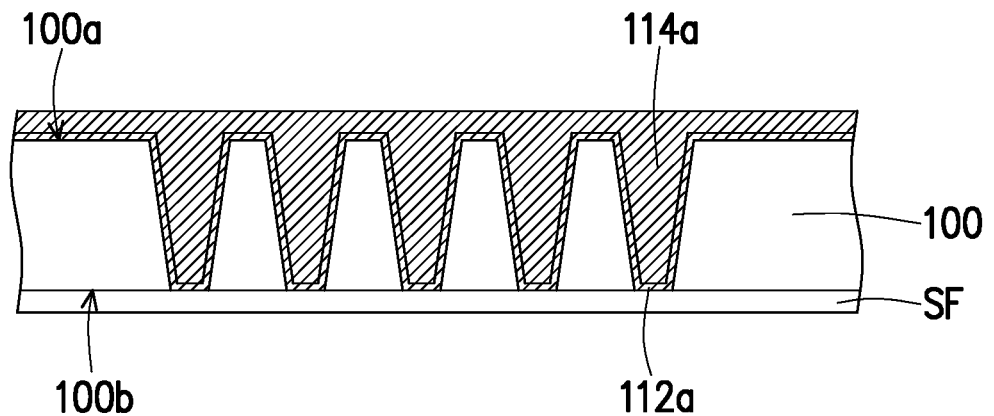

Referring to FIG. 1C, a conductive material layer 114a is deposited onto the seed material layer 112a. For example, the conductive material layer 114a is formed over the seed material layer 112a located on top of the first surface 100a of the insulating body 100 and over the seed material layer 112a located within the openings OP. In some embodiments, the conductive material layer 114a is formed through a plating process. The plating process is, for example, an electro-plating process, an immersion plating process, or the like. In some embodiments, the conductive material layer 114a is made of aluminum, titanium, copper, nickel, tungsten, and/or alloys thereof.

Figure 1D:
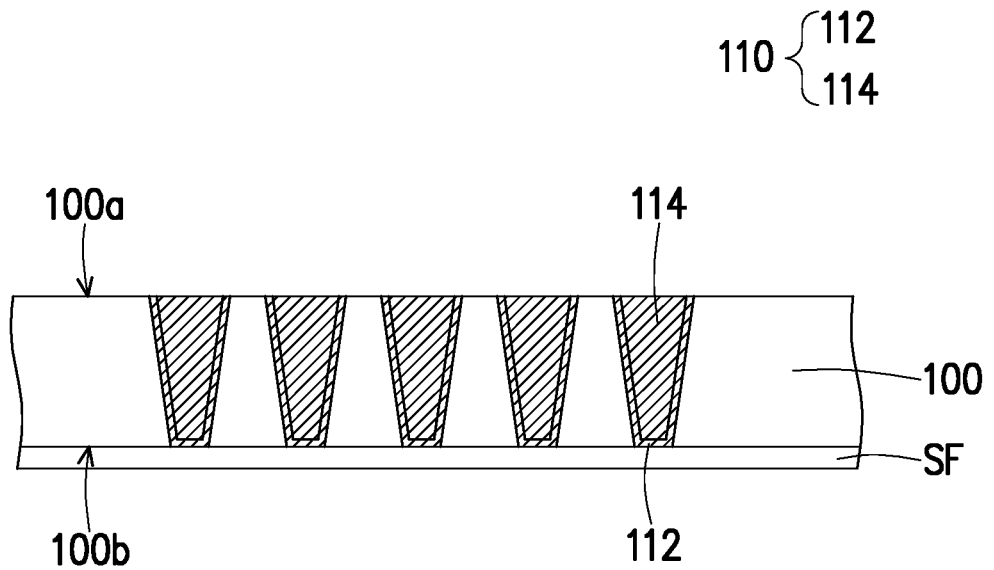

Referring to FIG. 1C and FIG. 1D, a portion of the seed material layer 112a and a portion of the conductive material layer 114a are removed to respectively form a seed layer 112 and a conductive layer 114 within each opening OP of the insulating body 100. In some embodiments, the portion of the seed material layer 112a and the portion of the conductive material layer 114a are removed until the first surface 100a of the insulating body 100 is exposed. For example, portions of the seed material layer 112a and the conductive material layer 114a that are above the first surface 100a of the insulating body 100 are removed to form the seed layer 112 and the conductive layer 114. In some embodiments, the portion of the seed material layer 112a and the portion of the conductive material layer 114 are removed through a planarization process, an etching process, or the like. The planarization process includes, for example, a chemical mechanical polishing (CMP) process, a mechanical grinding process, or the like. The etching process includes, for example, an anisotropic etching process such as dry etch or an isotropic etching process such as wet etch. In some embodiments, the remaining seed layer 112 and the remaining conductive material layer 114a within the same opening OP are collectively referred to as a through carrier vias (TCV) 110. As illustrated in FIG. 1D, multiple TCVs 110 are embedded within the insulating body 100.

Figure 1E:
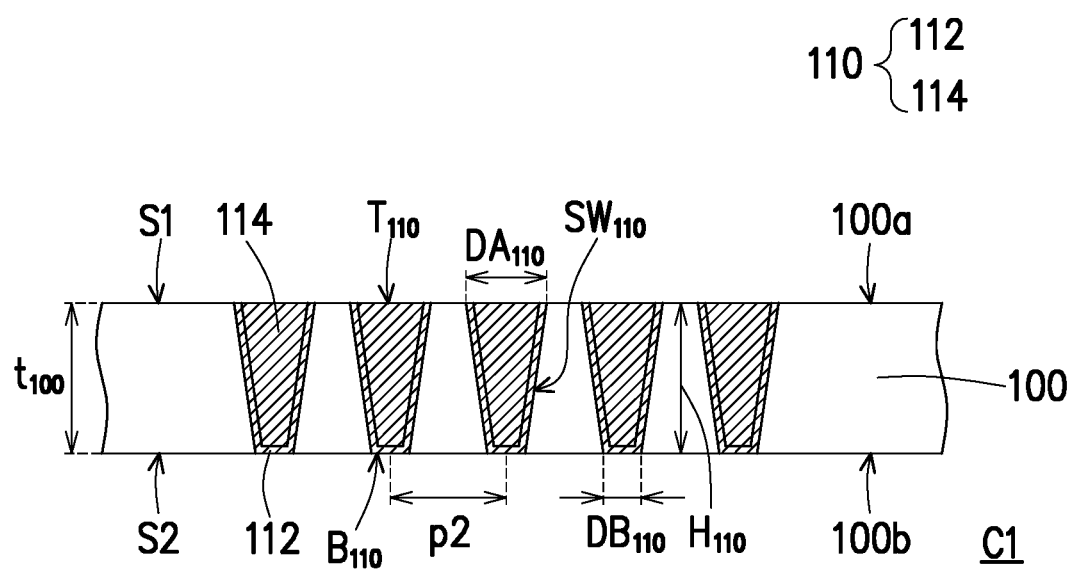

Referring to FIG. 1D and FIG. 1E, the sacrificial film SF is removed to expose the second surface 100b of the insulating body 100, so as to obtain a carrier substrate C1. In some embodiments, the sacrificial film SF is removed through an etching process, a stripping process, or the like. In some embodiments, the carrier substrate C1 includes the insulating body 100 and the TCVs 110. The TCVs 110 are embedded in the insulating body 100. For example, the insulating body 100 laterally encapsulates the TCVs 110. In some embodiments, since the TCVs 110 are formed by filling the seed layer 112 and the conductive material layer 114 into the openings OP, the geometry and the shape of the TCVs 110 are substantially the same as the openings OP of the insulating body 100. For example, a height $H_{110}$ of each TCV 110 is substantially the same as the depth $D_{OP}$ of each opening OP (shown in FIG. 1A). As illustrated in FIG. 1E, each TCV 110 penetrates through the insulating body 100. In other words, the height $H_{110}$ of each TCV 110 is substantially equal to the thickness two of the insulating body 100. In some embodiments, the height $H_{110}$ of each TCV 110 ranges from about 50 μm to about 1000 μm. In some embodiments, each TCV 110 has a slanted sidewall $SW_{110}$. That is, a first diameter $DA_{110}$ of each TCV 110 is different from a second diameter $DB_{110}$ of each TCV 110. For example, as illustrated in FIG. 1E, the first diameter $DA_{110}$ of each TCV 110 is larger than a second diameter $DB_{110}$ of each TCV 110. That is, each TCV 110 may be in the form of a conical frustum. However, the disclosure is not limited thereto. Depending on the shape of the openings OP of the insulting body 100, the TCVs 110 may have a substantially straight sidewall $SW_{110}$ in some alternative embodiments. That is, the first diameter $DA_{110}$ of each TCV 110 may be substantially equal to the second diameter $DB_{110}$ of each TCV 110, and each TCV 110 may be in the form of a cylinder. In some embodiments, the first diameter $DA_{110}$ ranges from about 20 μm to about 500 μm and the second diameter $DB_{110}$ ranges from about 5 μm to about 500 μm. In some embodiments, two adjacent TCVs 110 are formed to have a pitch p2 ranging from about 100 μm to about 1000 μm.

In some embodiments, each TCV 110 has a seed layer 112 and a conductive layer 114 surrounded by the seed layer 112. In some embodiments, the seed layer 112 is in physical contact with the insulating body 100. That is, each TCV 110 is in physical contact with the insulating body 100. As illustrated in FIG. 1E, top surfaces $T_{110}$ and bottom surfaces $B_{110}$ of the TCVs 110 are exposed by the insulating body 100. For example, the top surfaces $T_{110}$ of the TCVs 110 are substantially coplanar with the first surface 100a of the insulating body 100. Similarly, the bottom surfaces $B_{110}$ of the TCVs 110 are substantially coplanar with the second surface 100b of the insulating body 100. In some embodiments, the top surfaces $T_{110}$ of the TCVs 110 and the first surface 100a of the insulating body 100 are collectively referred to as a first surface S1 of the carrier substrate C1. On the other hand, the bottom surface $B_{110}$ of the TCVs 110 and the second surface 100b of the insulating body 100 are collectively referred to as a second surface S2 of the carrier substrate C1. In some embodiments, the first surface S1 of the carrier substrate C1 is opposite to the second surface S2 of the carrier substrate C1.

As mentioned above, the TCVs 110 are formed through an electro-plating process. As compared to the TCVs formed by electro-less plating process or conductive paste filling process, the TCVs 110 formed by the electro-plating process has higher electrical conductivity, higher throughput, as well as higher quality (i.e. free of voids within the TCVs 110). As such, the overall cost for manufacturing the carrier substrate C1 may be effectively reduced and the quality of the carrier substrate C1 may be ensured.

It should be noted that the process illustrated in FIG. 1A to FIG. 1E is one of the methods to manufacture the carrier substrate C1. Another way of manufacturing the carrier substrate C1 will be described below in conjunction with FIG. 2A to FIG. 2E.

Figure 2A:
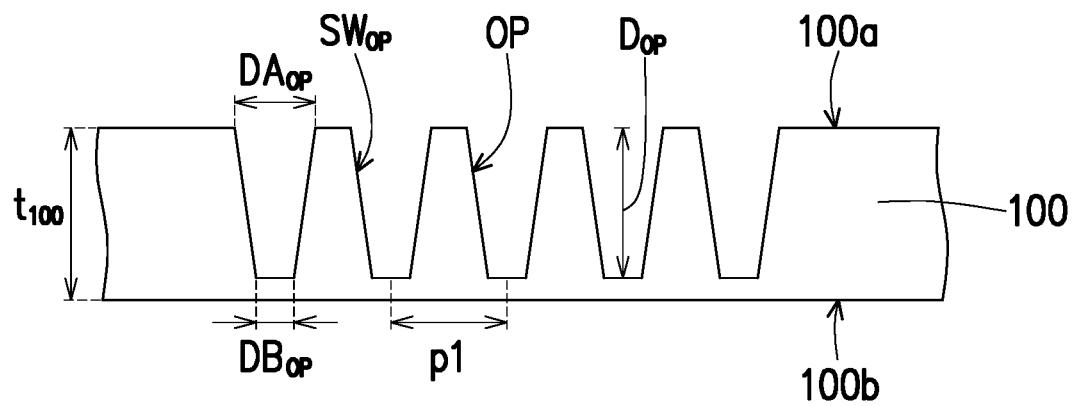
FIG. 2A to FIG. 2E are schematic cross-sectional views illustrating a manufacturing process of a carrier substrate in accordance with some alternative embodiments of the disclosure.

FIG. 2A to FIG. 2E are schematic cross-sectional views illustrating a manufacturing process of a carrier substrate C1 in accordance with some alternative embodiments of the disclosure. Referring to FIG. 2A, an insulating body 100 is provided. The insulating body in FIG. 2A is similar to the insulating body 100 in FIG. 1A, so the detailed description thereof is omitted herein. However, as illustrated in FIG. 2A, the openings OP do not penetrate through the insulating body 100. For example, the depth $D_{OP}$ of each opening OP is smaller than the thickness $t_{100}$ of the insulating body 100. Moreover, the sacrificial film in FIG. 1A is omitted in FIG. 2A. In other words, the second surface 100b of the insulating body 100 is exposed in FIG. 2A.

Figure 2B:
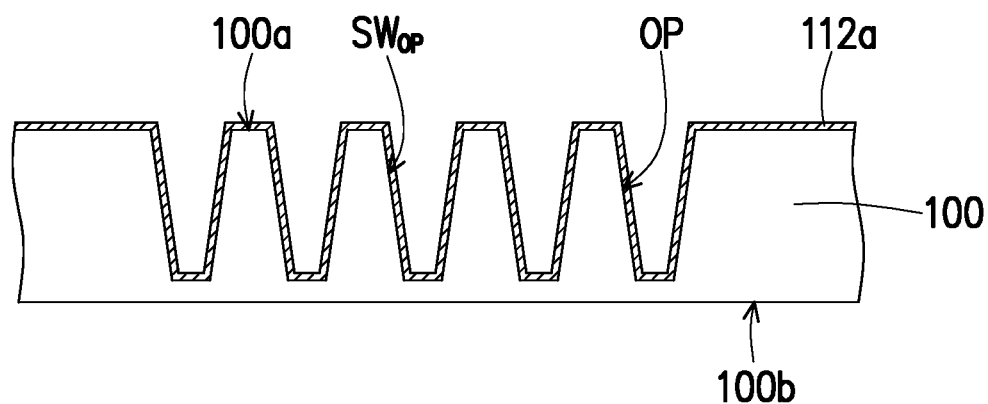
Figure 2C:
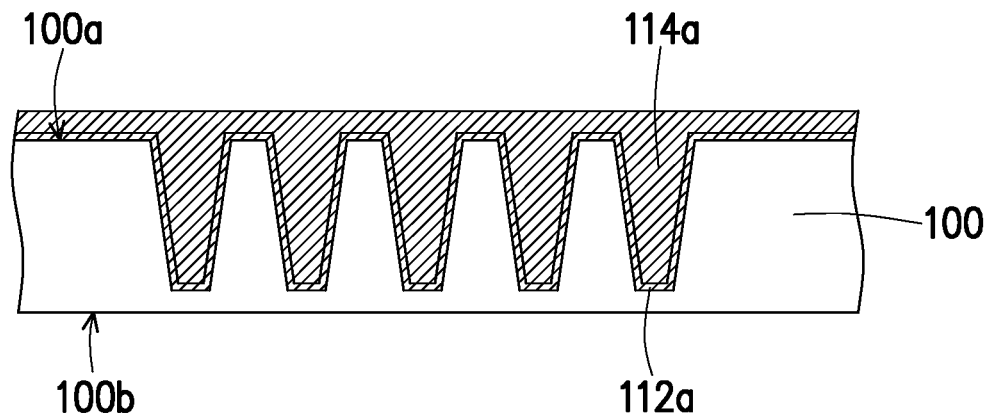
Figure 2D:
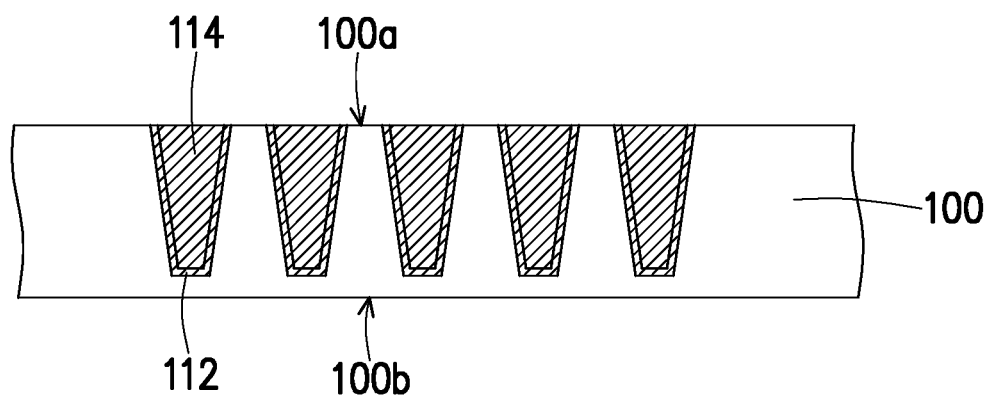

Referring to FIG. 2B to FIG. 2D, the steps illustrated in FIG. 2B to FIG. 2D are similar to the steps illustrated in FIG. 1B to FIG. 1D, so the detailed descriptions thereof are omitted herein.

Figure 2E:
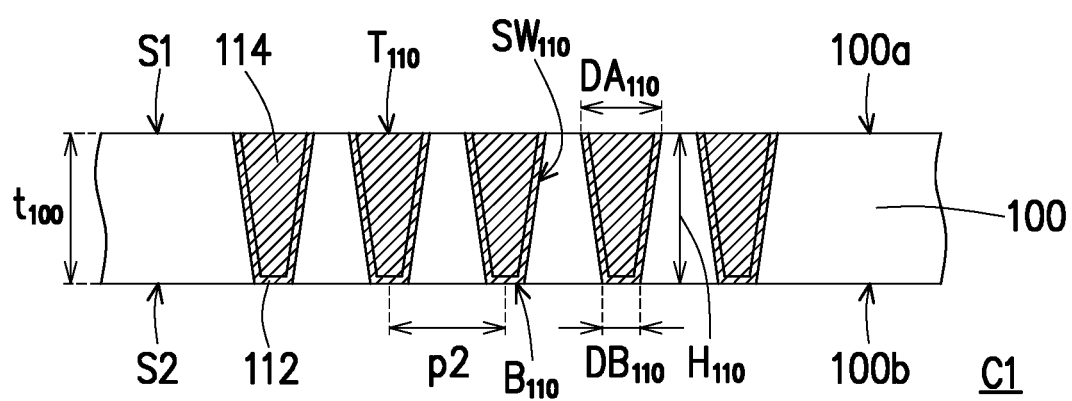

Referring to FIG. 2D and FIG. 2E, a portion of the insulating body 100 is removed to expose the bottom surfaces $B_{110}$ of the TCVs 110, so as to obtain a carrier substrate C1. For example, a planarization process or an etching process is performed on the insulating body 100 from the second surface 100b shown in FIG. 2D until the bottom surfaces $B_{110}$ of the TCVs 110 are revealed. The planarization process includes, for example, a CMP process, a mechanical grinding process, or the like. The etching process includes, for example, an anisotropic etching process such as dry etch or an isotropic etching process such as wet etch. In some embodiments, the TCVs 110 may be slightly planarized or etched from the bottom surfaces $B_{110}$ thereof to further reduce the overall thickness of the carrier substrate C1. It should be noted that although FIG. 1A to FIG. 1E and FIG. 2A to FIG. 2E illustrated two different methods of manufacturing the carrier substrate C1, the structure of the carrier substrate C1 obtained through these two methods may be substantially the same.

In some embodiments, the carrier substrate C1 may be utilized in various application. For example, the carrier substrate C1 may be incorporate into various package structures to serve as a supporting mechanism which also provides electrical path. The applications of the carrier substrate C1 will be described below in conjunction with FIG. 3A to FIG. 3G, FIG. 4A to FIG. 4G, and FIG. 5.

Figure 3A:
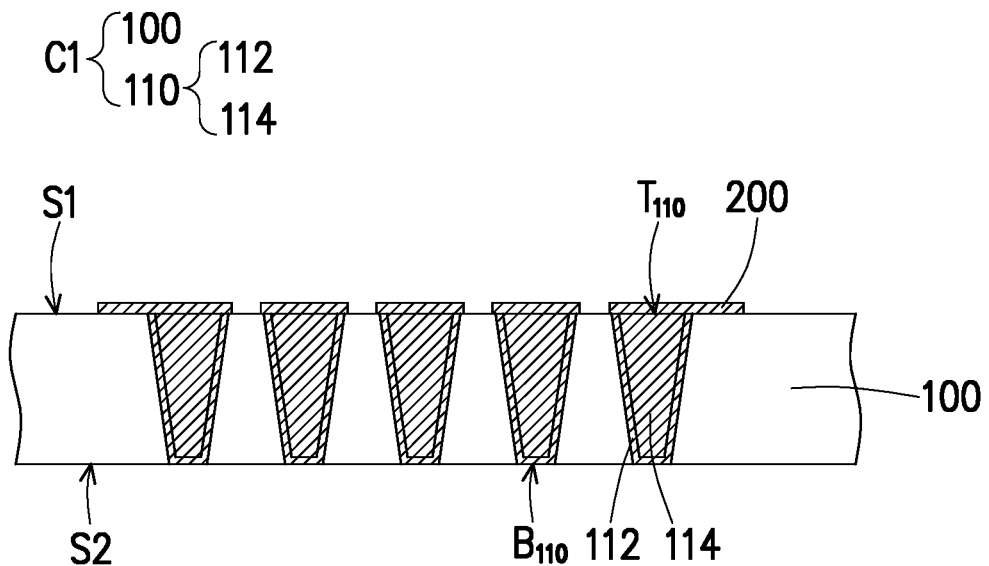
FIG. 3A to FIG. 3G are schematic cross-sectional views illustrating a manufacturing process of a package structure in accordance with some alternative embodiments of the disclosure.

FIG. 3A to FIG. 3G are schematic cross-sectional views illustrating a manufacturing process of a package structure 10 in accordance with some alternative embodiments of the disclosure. Referring to FIG. 3A, the carrier substrate C1 in FIG. 1E and FIG. 2E is provided. Thereafter, a plurality of routing patterns 200 is formed on the first surface S1 of the insulating body 100. For example, the routing patterns 200 are formed to be in physical contact with the top surface $T_{110}$ of the TCVs 110 to render electrical connection with the TCVs 110. In some embodiments, the routing patterns 200 are formed through a plating process followed by an etching process. The plating process includes, for example, an electro-plating process, an electro-less plating process, an immersion plating process, or the like. The etching process includes, for example, an anisotropic etching process such as dry etch or an isotropic etching process such as wet etch. In some embodiments, the routing patterns 200 includes copper, nickel, titanium, a combination thereof, or the like.

Figure 3B:
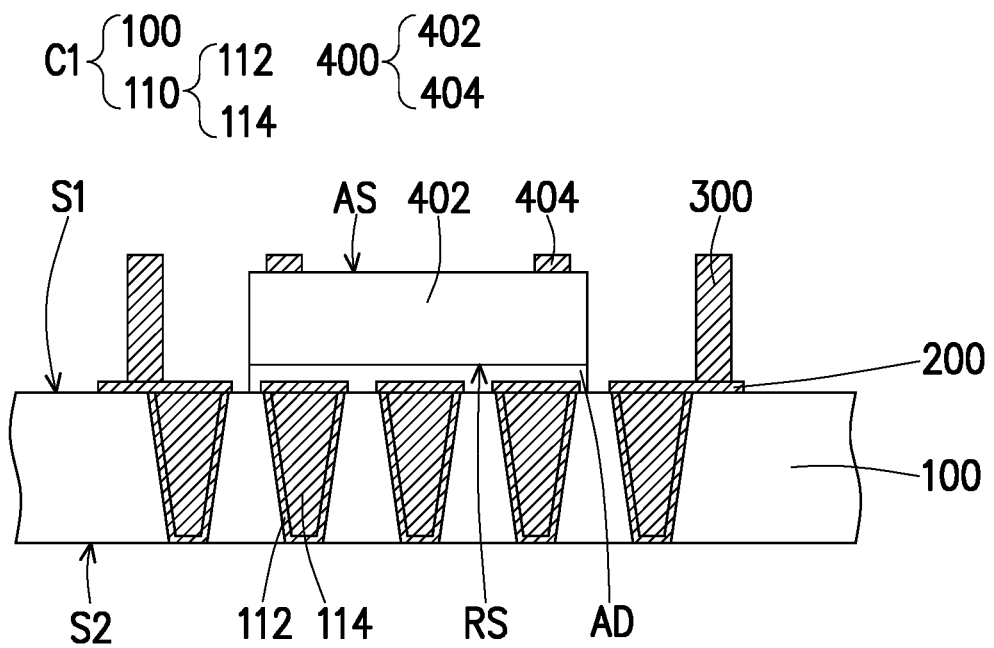

Referring to FIG. 3B, a plurality of through insulating vias (TIV) 300 is formed over the routing patterns 200. In some embodiments, the TIVs 300 are formed by the following steps. First, a seed material layer (not shown) is conformally formed over the routing patterns 200 and the first surface S1 of the carrier substrate C1. In some embodiments, the seed material layer includes a titanium/copper composite layer, and is formed by a sputtering process. Thereafter, a photoresist layer (not shown) with openings is formed on the seed material layer, and the openings of the photoresist layer expose the intended locations for the subsequently formed TIVs 300. Afterwards, a plating process is performed to form a metal material layer (e.g., a copper layer) on the seed material layer exposed by the openings of the photoresist layer. The photoresist layer and the underlying seed material layer are then removed to form the TIVs 300.

As illustrated in FIG. 3B, a die 400 is disposed over the first surface S1 of the carrier substrate C1. In some embodiments, the die 400 is disposed through a pick-and-place process or the like. In some embodiments, the die 400 is attached to the first surface S1 of the carrier substrate C1 through an adhesive layer AD. For example, the adhesive layer AD is sandwiched between the die 400 and the first surface S1 of the carrier substrate C1 to fix the die 400 in place. In some embodiments, the adhesive layer AD covers some of the routing patterns 200. In other words, some of the routing patterns 200 are located directly underneath the die 400. In some embodiments, the adhesive layer AD includes die attach film (DAF) or the like. In some embodiments, each die 400 includes a semiconductor substrate 402 and a plurality of conductive posts 404. In some embodiments, the semiconductor substrate 402 is made of silicon or germanium. However, the disclosure is not limited thereto. The semiconductor substrate 402 may also include other suitable semiconductor materials, such as elements in Group III, Group IV, and/or Group V in the periodic table. As illustrated in FIG. 3B, the conductive posts 404 are disposed over the semiconductor substrate 402. For example, the conductive posts 404 protrude from the semiconductor substrate 402. The conductive posts 404 may be copper posts or other suitable metallic posts. In some embodiments, the die 400 further includes an interconnection structure (not shown) and a plurality of conductive pads (not shown) embedded in the semiconductor substrate 402 or located between the conductive posts 404 and the semiconductor substrate 402.

In some embodiments, the die 400 has an active surface AS and a rear surface RS opposite to the active surface AS. As illustrated in FIG. 3B, the rear surface RS of the die 400 is attached to the adhesive layer AD while the active surface AS of the die 400 faces upward. In some embodiments, the active surface AS of the die 400 is exposed to atmospheric environment.

In some embodiments, the TIVs 300 are formed prior to the placement of the die 400. However, the disclosure is not limited thereto. In some alternative embodiments, the die 400 may be placed prior to the formation of the TIVs 300.

Figure 3C:
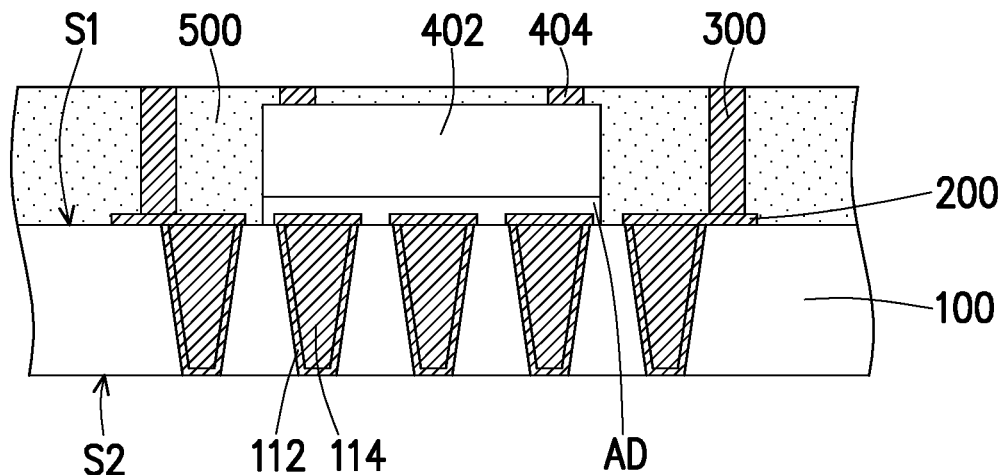

Referring to FIG. 3C, an encapsulant 500 is formed over the first surface S1 of the carrier substrate C1 to laterally encapsulate the TIVs 300 and the die 400. In some embodiments, the encapsulant 500 includes a molding compound, a molding underfill, a resin (such as epoxy), or the like. In some alternative embodiments, the encapsulant 500 includes a photo-sensitive material such as polybenzoxazole (PBO), polyimide (PI), benzocyclobutene (BCB), a combination thereof, or the like. In some embodiments, the encapsulant 500 includes fillers. The fillers may be particles made of silica, aluminum dioxide, or the like. In some embodiments, the encapsulant 500 is formed by the following steps. First, an insulating material (not shown) is formed on the routing patterns 200 and the first surface S1 of the carrier substrate C1 through a molding process, so as to encapsulate the TIVs 300 and the die 400. The molding process includes, for example, a transfer molding process, a compression molding process, or the like. During the molding process, the conductive posts 404 are encapsulated by the insulating material. In other words, the conductive posts 404 are not revealed and are well protected by the insulating material. Thereafter, the insulating material is grinded until top surfaces of the TIVs 300 and top surfaces of the conductive posts 404 are exposed, so as to form the encapsulant 500. In some embodiments, the insulating material is grinded by a mechanical grinding process and/or a CMP process. In some embodiments, portions of the TIVs 300 and portions of the conductive posts 404 are also slightly grinded. As illustrated in FIG. 3C, after the grinding process, the TIVs 300 penetrate through the encapsulant 500.

Figure 3D:
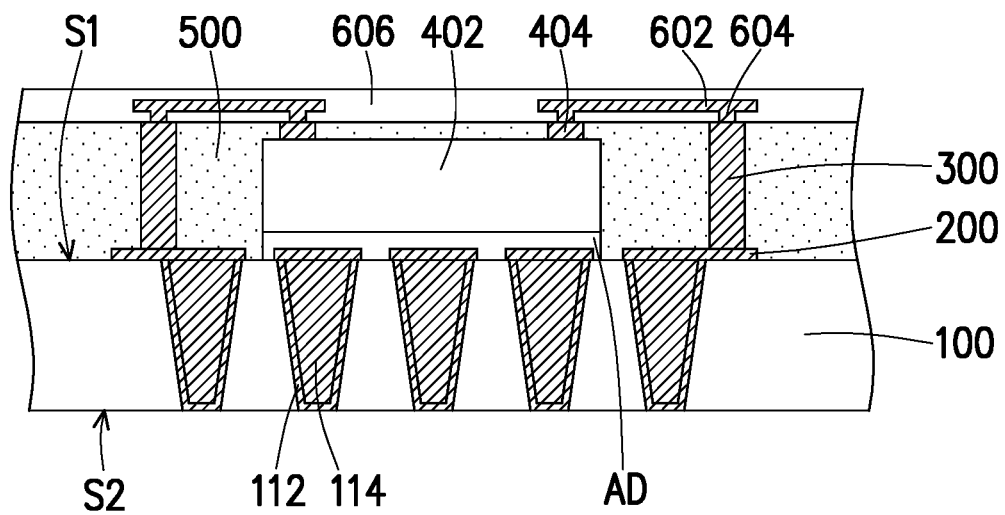

Referring to FIG. 3D, a redistribution structure 600 is formed over the TIVs 300, the die 400, and the encapsulant 500. In some embodiments, the redistribution structure 600 includes a plurality of conductive patterns 602, a plurality of conductive vias 604, and a dielectric layer 606. In some embodiments, the conductive patterns 602 and the conductive vias 604 are formed through a plating process followed by an etching process. The plating process includes, for example, an electro-plating process, an electro-less plating process, an immersion plating process, or the like. The etching process includes, for example, an anisotropic etching process such as dry etch or an isotropic etching process such as wet etch. In some embodiments, the conductive patterns 602 and the underlying conductive vias 604 are simultaneously formed. In some embodiments, a material of the conductive patterns 602 and the conductive vias 604 includes aluminum, titanium, copper, nickel, tungsten, and/or alloys thereof. In some embodiments, the dielectric layer 606 encapsulates the conductive patterns 602 and the conductive vias 604. In some embodiments, the dielectric layer 606 is a polymer layer made of PBO, PI, BCB, a combination thereof, or the like. For simplicity, the dielectric layer 606 is illustrated as a bulky layer in FIG. 3D, but it should be understood that the dielectric layer 606 may be constituted by multiple dielectric layers.

As illustrated in FIG. 3D, the conductive vias 604 are in physical contact with the TIVs 300 and the conductive posts 404 of the die 400. In other words, the conductive vias 604 render electrical connection between the redistribution structure 600 and the TIVs 300 and between the redistribution structure 600 and the die 400. In some embodiments, the die 400 is electrically connected to the TCVs 110 of the carrier substrate C1 sequentially through the redistribution structure 600, the TIVs 300, and the routing patterns 200.

Figure 3E:
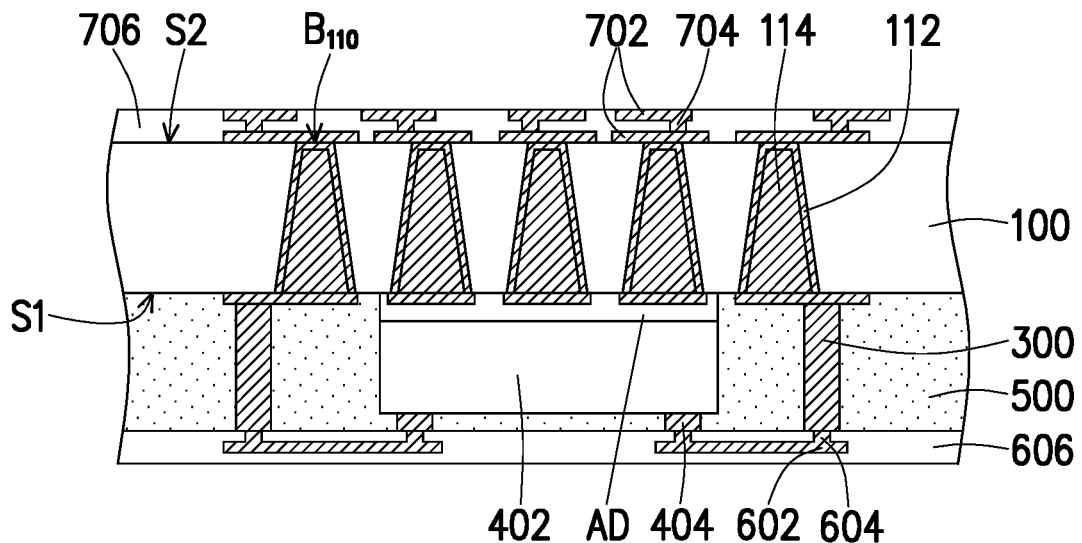

Referring to FIG. 3D and FIG. 3E, the structure illustrated in FIG. 3D is flipped upside down such that the second surface S2 of the carrier substrate C1 faces upward. Thereafter, a redistribution structure 700 is formed on the second surface S2 of the carrier substrate C1. In some embodiments, the redistribution structure 700 includes a plurality of conductive patterns 702, a plurality of conductive vias 704, and a dielectric layer 706. The conductive patterns 702, the conductive vias 704, and the dielectric layer 706 of the redistribution structure 700 are respectively similar to the conductive patterns 602, the conductive vias 604, and the dielectric layer 606 of the redistribution structure 600, so the detailed descriptions thereof are omitted herein. For simplicity, the dielectric layer 706 is illustrated as a bulky layer in FIG. 3E, but it should be understood that the dielectric layer 706 may be constituted by multiple dielectric layers. The conductive patterns 702 and the dielectric layers of the dielectric layer 706 are stacked alternately. In some embodiments, two adjacent conductive patterns 702 in the vertical direction are electrically connected to each other through the conductive vias 704 sandwiched therebetween. As illustrated in FIG. 3E, the bottommost conductive patterns 702 are in physical contact with the bottom surface $B_{110}$ of the TCVs 110. In other words, the redistribution structure 700 is electrically connected to the TCVs 110 through the bottom-most conductive patterns 702. In some embodiments, the dielectric layer 706 exposes the topmost conductive patterns 702. It should be noted that although FIG. 3A to FIG. 3E illustrated that the routing patterns 200, the TIVs 300, the die 400, the encapsulant 500, and the redistribution structure 600 are formed on the carrier substrate C1 prior to the formation of the redistribution structure 700, the disclosure is not limited thereto. In some alternative embodiments, the redistribution structure 700 may be formed on the carrier substrate C1 prior to the routing patterns 200, the TIVs 300, the die 400, the encapsulant 500, and the redistribution structure 600.

Figure 3F:
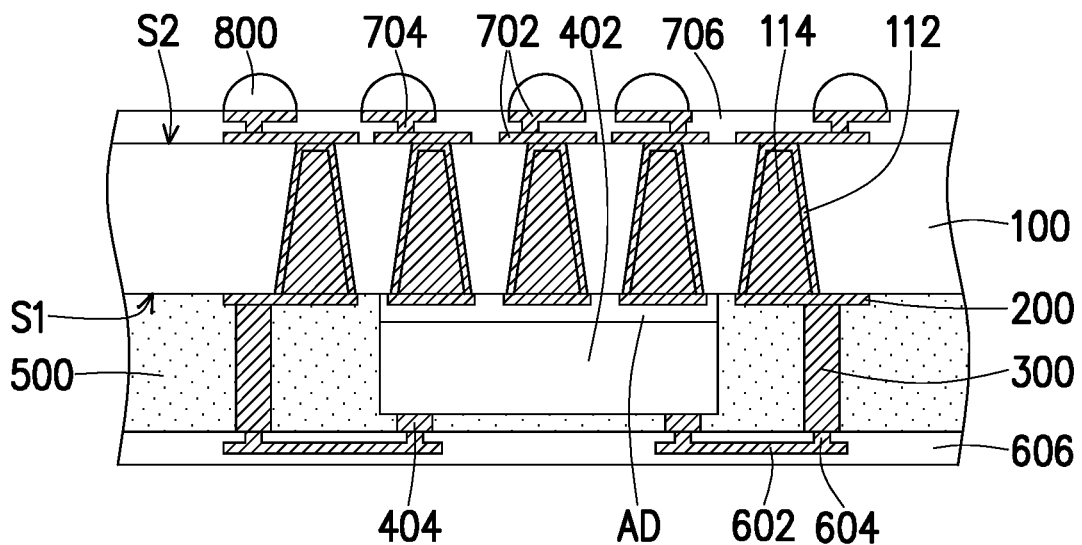

Referring to FIG. 3F, a plurality of conductive terminals 800 is formed on the redistribution structure 700. For example, the conductive terminals 800 are formed on the topmost conductive patterns 702 exposed by the dielectric layer 706. In some embodiments, the conductive terminals 800 are solder balls, ball grid array (BGA) balls, or the like. In some embodiments, the conductive terminals 800 are made of a conductive material with low resistivity, such as Sn, Pb, Ag, Cu, Ni, Bi, or an alloy thereof.

Figure 3G:
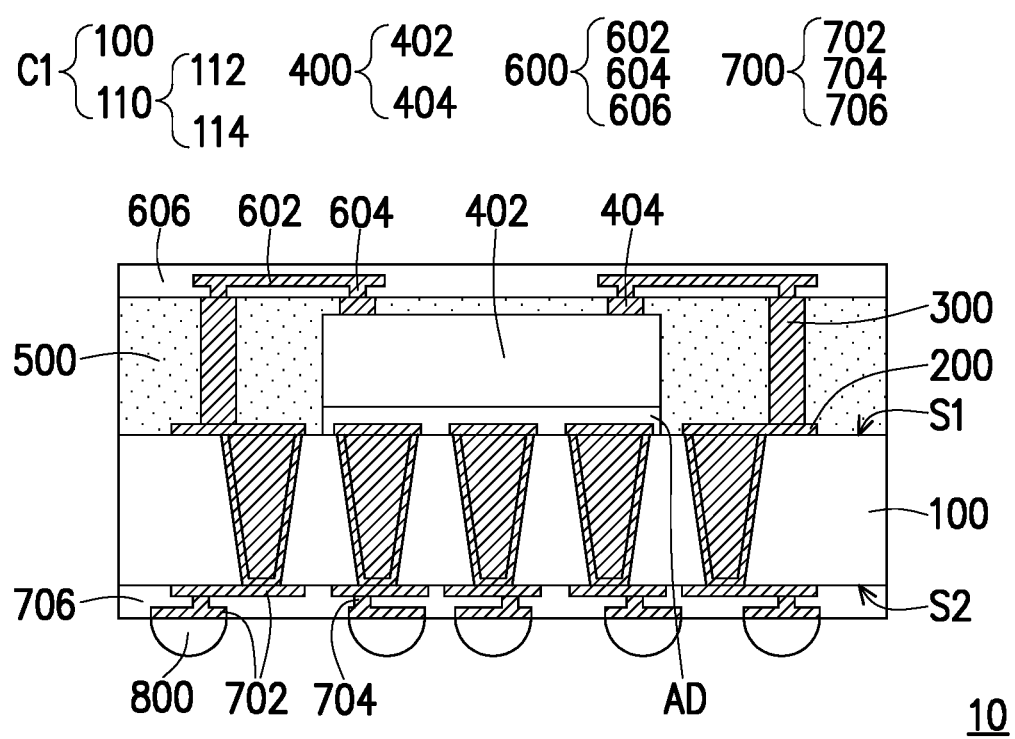

Referring to FIG. 3F and FIG. 3G, the structure illustrated in FIG. 3F is flipped upside down and a singulation process is performed on the structure to obtain a package structure 10. In some embodiments, the singulation process typically involves dicing with a rotation blade and/or a laser beam. In other words, the singulation process includes a laser cutting process, a mechanical cutting process, a laser grooving process, other suitable processes, or a combination thereof.

Figure 4A:
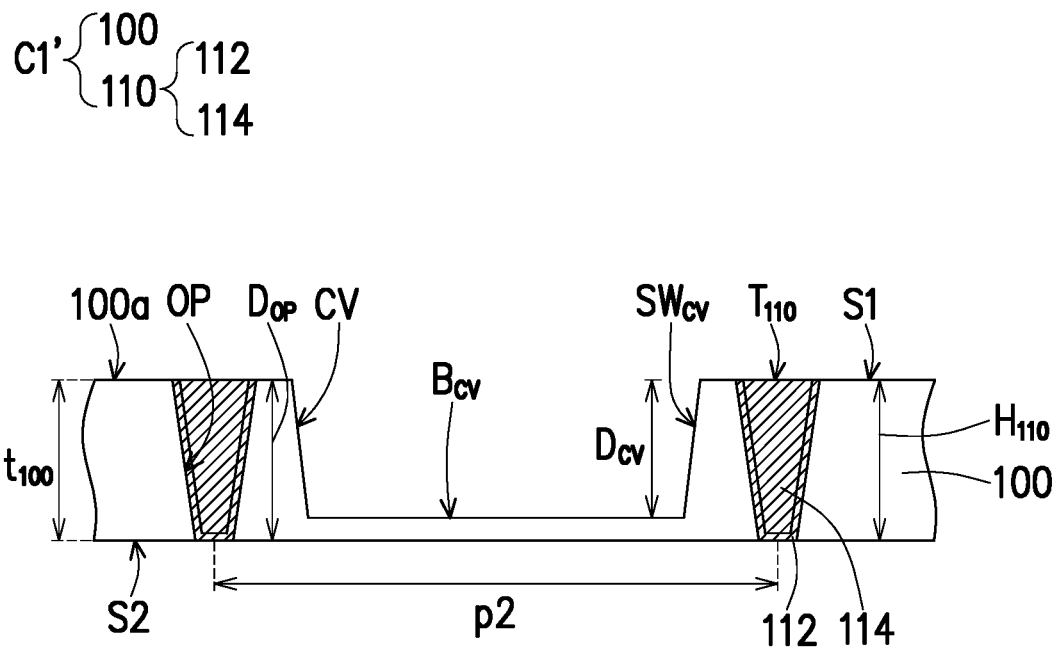
FIG. 4A to FIG. 4G are schematic cross-sectional views illustrating a manufacturing process of a package structure in accordance with some alternative embodiments of the disclosure.

FIG. 4A to FIG. 4G are schematic cross-sectional views illustrating a manufacturing process of a package structure 20 in accordance with some alternative embodiments of the disclosure. Referring to FIG. 4A, a carrier substrate C1' is provided. In some embodiments, the carrier substrate C1' in FIG. 4A is similar to the carrier substrate C1 in FIG. 1E and FIG. 2E, so the detailed description thereof is omitted herein. The difference between the carrier substrate C1' in FIG. 4A and the carrier substrate C1 in FIG. 1E and FIG. 2E is that a pitch p2 between two adjacent TCVs 110 in the carrier substrate C1' of FIG. 4A is larger than the pitch p2 between two adjacent TCVs 110 in the carrier substrate C1 of FIG. 1E and FIG. 2E. Subsequently, a cavity CV is formed in the insulating body 100. In other words, the insulating body 100 of the carrier substrate C1' has the cavity CV. In some embodiments, the cavity CV is formed by laser drilling, mechanical drilling, etching, or the like. In some embodiments, the cavity CV is formed between adjacent TCVs 110. In other words, the cavity CV is surrounded by the TCVs 110. In some embodiments, a depth $D_{CV}$ of the cavity CV is smaller than a depth $D_{OP}$ of each opening OP. Similarly, the depth $D_{CV}$ of the cavity CV is also smaller than the height $H_{110}$ of each TCV 110. That is, the cavity CV does not penetrate through the insulating body 100. For example, the depth $D_{CV}$ of the cavity CV ranges from about 50 μm to about 750 μm. In some embodiments, sidewalls $SW_{CV}$ of the cavity CV are slanted. In some embodiments, the first surface 100a of the insulating body 100, the top surface $T_{110}$ of the TCVs 110, the sidewalls $SW_{CV}$ of the cavity CV, and a bottom surface $B_{CV}$ of the cavity CV are collectively referred to as the first surface S1 of the carrier substrate C1'.

Figure 4B:
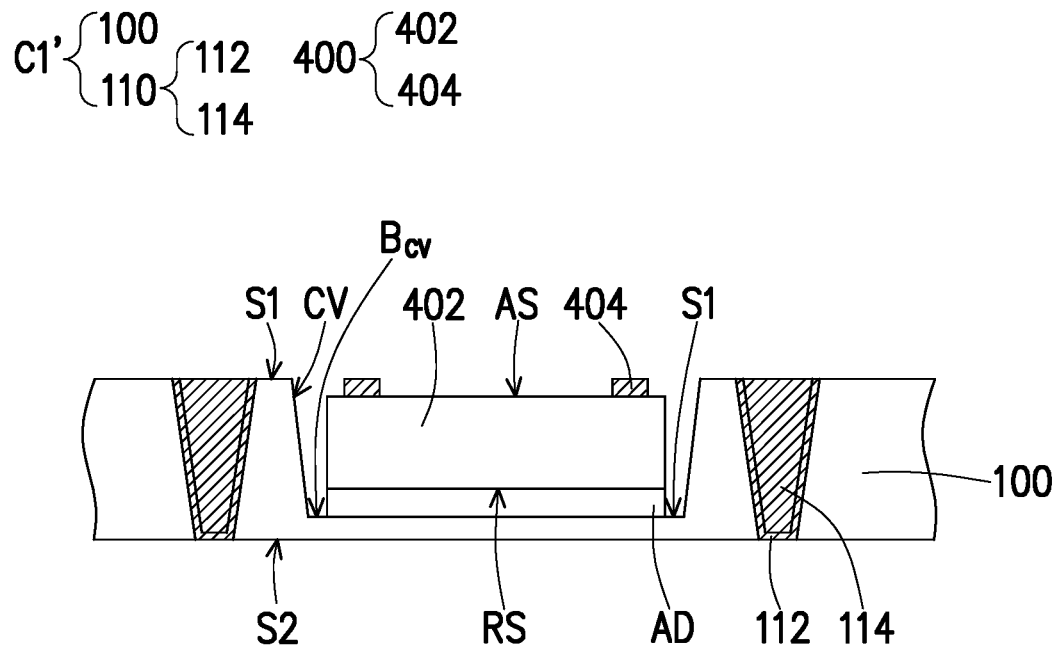

Referring to FIG. 4B, a die 400 is disposed within the cavity CV. In some embodiments, the die 400 in FIG. 4B is similar to the die 400 in FIG. 3B, so the detailed description thereof is omitted herein. As illustrated in FIG. 4B, the die 400 is placed such that the active surface AS of the die 400 faces upward. On the other hand, the rear surface RS of the die 400 is attached to the bottom surface $B_{CV}$ of the cavity CV through an adhesive layer AD. As mentioned above, the bottom surface $B_{CV}$ is being considered as part of the first surface S1 of the carrier substrate C1', so the die 400 is being considered as disposed over the first surface S1 of the carrier substrate C1'. In some embodiments, the adhesive layer AD includes DAF or the like.

Figure 4C:
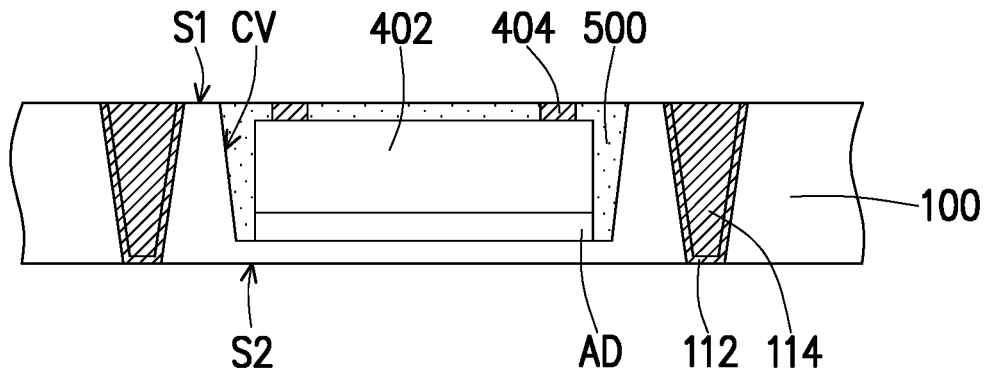

Referring to FIG. 4C, an encapsulant 500 is formed in the cavity CV to laterally encapsulate the die 400. That is, the die 400 and the encapsulant 500 are both located within the cavity CV, and at least a portion of the encapsulant 500 is sandwiched between the die 400 and the insulating body 100. In some embodiments, the encapsulant 500 in FIG. 4C is similar to the encapsulant 500 in FIG. 3C, so the detailed description thereof is omitted herein. As illustrated in FIG. 4C, the encapsulant 500 exposes top surfaces of the conductive posts 404 of the die 400 for future electrical connection.

Figure 4D:
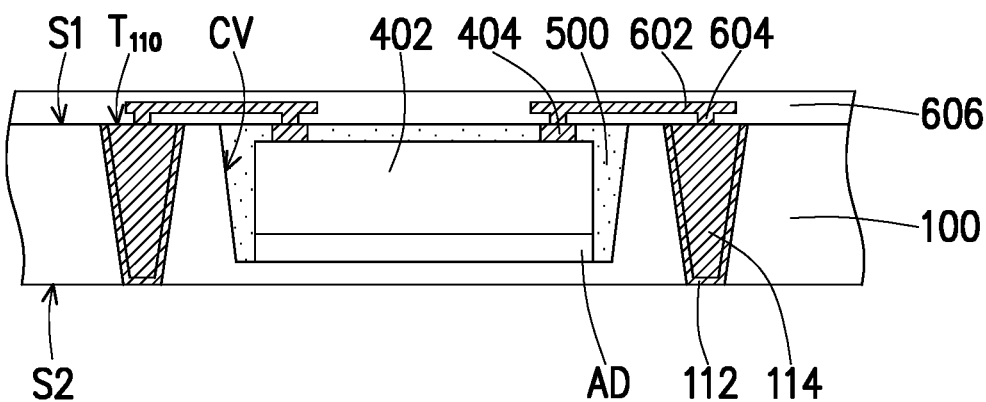

Referring to FIG. 4D, a redistribution structure 600 is formed on the insulating body 100, the TCVs 110, the die 400, and the encapsulant 500. In some embodiments, the redistribution structure 600 includes a plurality of conductive patterns 602, a plurality of conductive vias 604, and a dielectric layer 606. In some embodiments, the conductive patterns 602, the conductive vias 604, and the dielectric layer 606 in FIG. 4D are respectively similar to the conductive patterns 602, the conductive vias 604, and the dielectric layer 606 in FIG. 3D, so the detailed descriptions thereof are omitted herein. As illustrated in FIG. 4D, the conductive vias 604 are in physical contact with the TCVs 110 and the conductive posts 404 of the die 400. In other words, the conductive vias 604 render electrical connection between the redistribution structure 600 and the TCVs 110 and between the redistribution structure 600 and the die 400. In some embodiments, the die 400 is electrically connected to the TCVs 110 of the carrier substrate C1' through the redistribution structure 600.

Figure 4E:
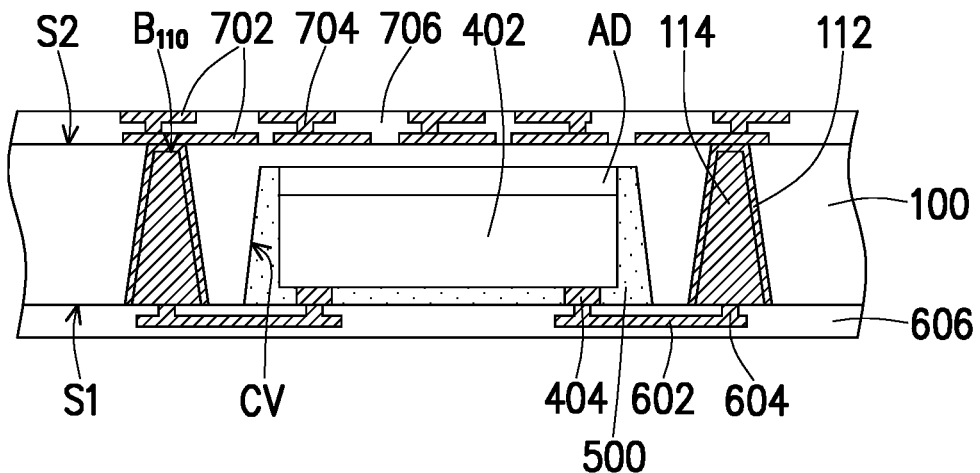

Referring to FIG. 4D and FIG. 4E, the structure illustrated in FIG. 4D is flipped upside down such that the second surface S2 of the carrier substrate C1' faces upward. Thereafter, a redistribution structure 700 is formed on the second surface S2 of the carrier substrate C1'. In some embodiments, the redistribution structure 700 includes a plurality of conductive patterns 702, a plurality of conductive vias 704, and a dielectric layer 706. In some embodiments, the conductive patterns 702, the conductive vias 704, and the dielectric layer 706 in FIG. 4E are respectively similar to the conductive patterns 702, the conductive vias 704, and the dielectric layer 706 in FIG. 3E, so the detailed descriptions thereof are omitted herein.

Figure 4F:
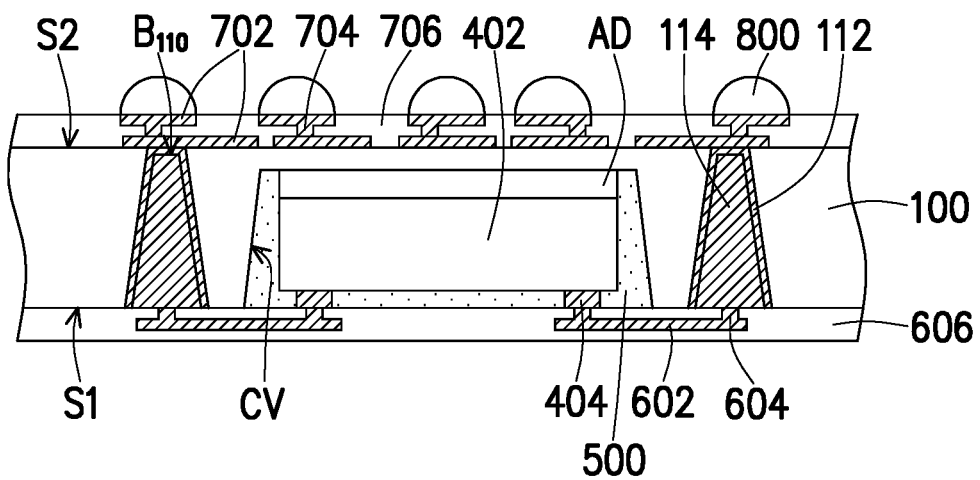

Referring to FIG. 4F, a plurality of conductive terminals 800 is formed on the redistribution structure 700. In some embodiments, the conductive terminals 800 in FIG. 4F are similar to the conductive terminals 800 in FIG. 3F, so the detailed descriptions thereof are omitted herein.

Figure 4G:
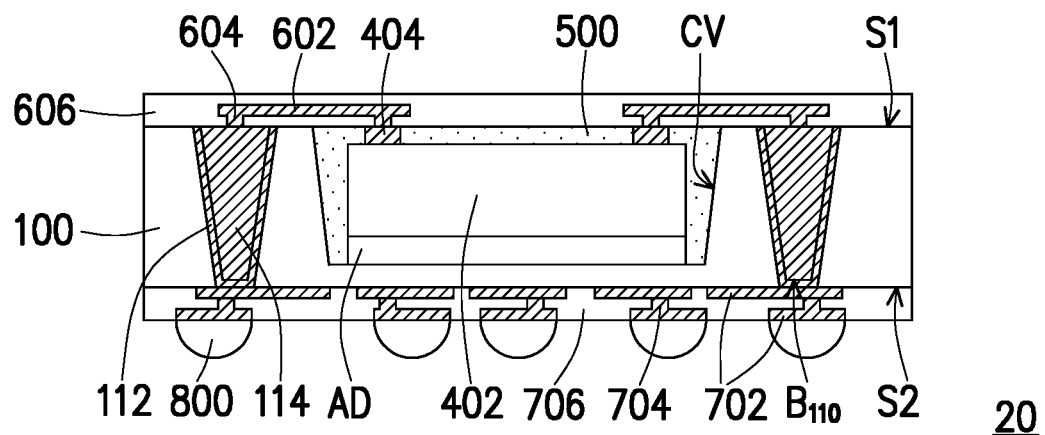

Referring to FIG. 4F and FIG. 4G, the structure illustrated in FIG. 4F is flipped upside down and a singulation process is performed on the structure to obtain a package structure 20. In some embodiments, the singulation process typically involves dicing with a rotation blade and/or a laser beam. In other words, the singulation process includes a laser cutting process, a mechanical cutting process, a laser grooving process, other suitable processes, or a combination thereof.

Figure 5:
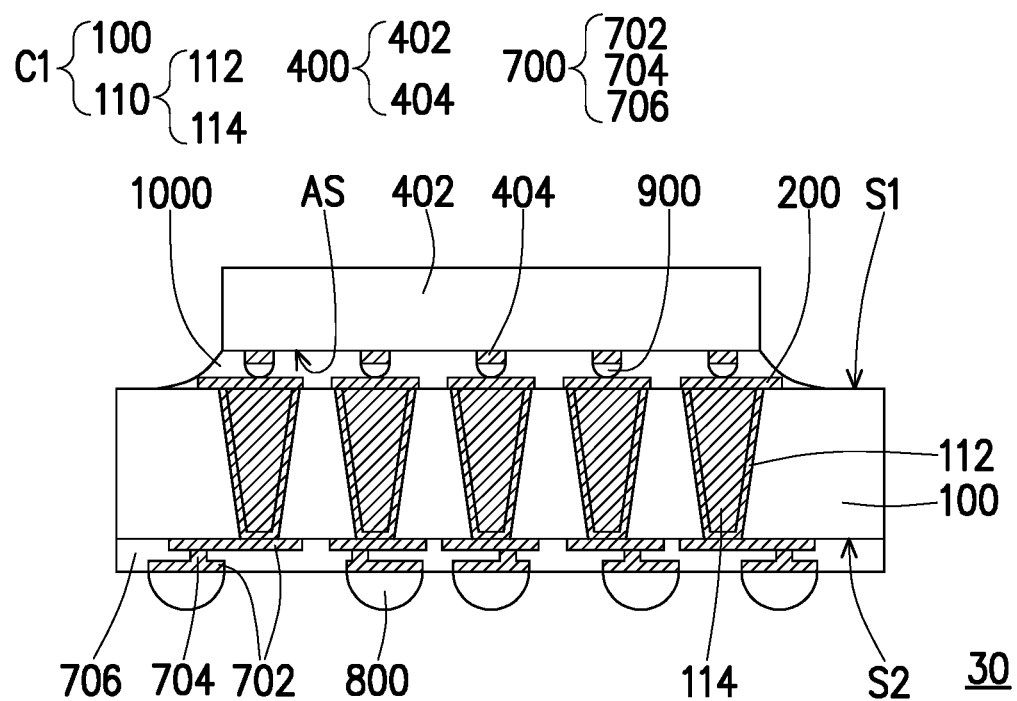
FIG. 5 is a schematic cross-sectional view illustrating a package structure in accordance with some alternative embodiments of the disclosure.

FIG. 5 is a schematic cross-sectional view illustrating a package structure 30 in accordance with some alternative embodiments of the disclosure. Referring to FIG. 5, the package structure 30 includes a carrier substrate C1, a plurality of routing patterns 200, a die 400, a redistribution structure 700, a plurality of connectors 900, and an underfill layer 1000. In some embodiments, the carrier substrate C1, the routing patterns 200, the die 400, and the redistribution structure 700 in FIG. 5 are respectively similar to the carrier substrate C1, the routing patterns 200, the die 400, and the redistribution structure 700 in FIG. 3G, so the detailed descriptions thereof are omitted herein.

As illustrated in FIG. 5, the die 400 is disposed over the first surface S1 of the carrier substrate C1. In some embodiments, the die 400 is placed in a face down manner. In other words, the die 400 is placed such that the active surface AS of the die 400 faces downward. In some embodiments, the die 400 is bonded to the routing patterns 200 through flip-chip bonding. For example, the conductive posts 404 of the die 400 are attached to the routing patterns 200 through the connectors 900. In some embodiments, the connectors 900 are made of a conductive material with low resistivity, such as Sn, Pb, Ag, Cu, Ni, Bi, or an alloy thereof.

In some embodiments, the underfill layer 1000 laterally encapsulates the routing patterns 200, the conductive posts 404 of the die 400, and the connectors 900 to protect these elements. In some embodiments, the underfill layer 1000 further covers a portion of each sidewall of the semiconductor substrate 402 of the die 400. In some embodiments, a material of the underfill layer 1000 is an insulating material and may include a resin (e.g., epoxy resin), a filler material, a stress release agent (SRA), an adhesion promoter, other material, or a combination thereof. In some embodiments, the underfill layer 1000 is optional.

As illustrated in FIG. 5, the redistribution structure 700 and the conductive terminals 800 are sequentially disposed over the second surface S2 of the carrier substrate C1. In some embodiments, the TCVs 110 allow electrical connection between the die 400 over the first surface S1 of the carrier substrate C1 and the redistribution structure 700 over the second surface S2 of the carrier substrate C1.

Figure 6A:
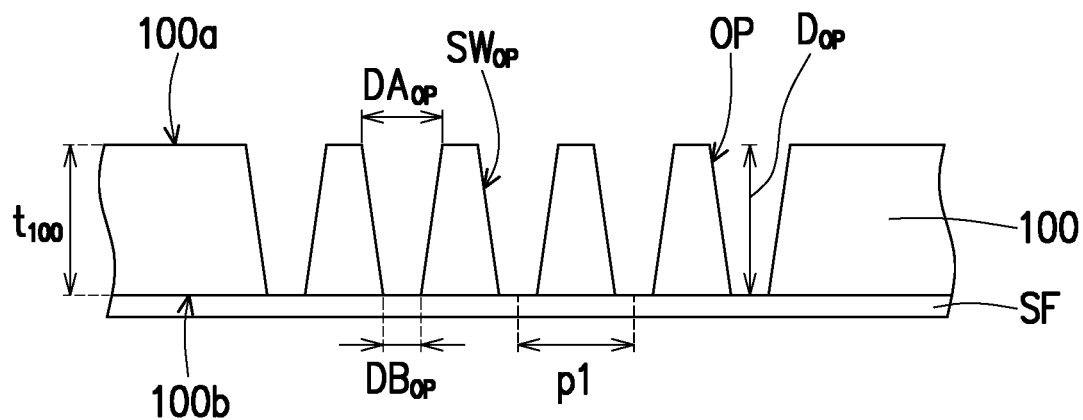
FIG. 6A to FIG. 6E are schematic cross-sectional views illustrating a manufacturing process of a carrier substrate in accordance with some alternative embodiments of the disclosure.

FIG. 6A to FIG. 6E are schematic cross-sectional views illustrating a manufacturing process of a carrier substrate C2 in accordance with some alternative embodiments of the disclosure. Referring to FIG. 6A, an insulating body 100 is provided on a sacrificial film SF. In some embodiments, the insulating body 100 and the sacrificial film SF in FIG. 6A are respectively similar to the insulating body 100 and the sacrificial film SF in FIG. 1A, so the detailed descriptions thereof are omitted herein.

Figure 6B:
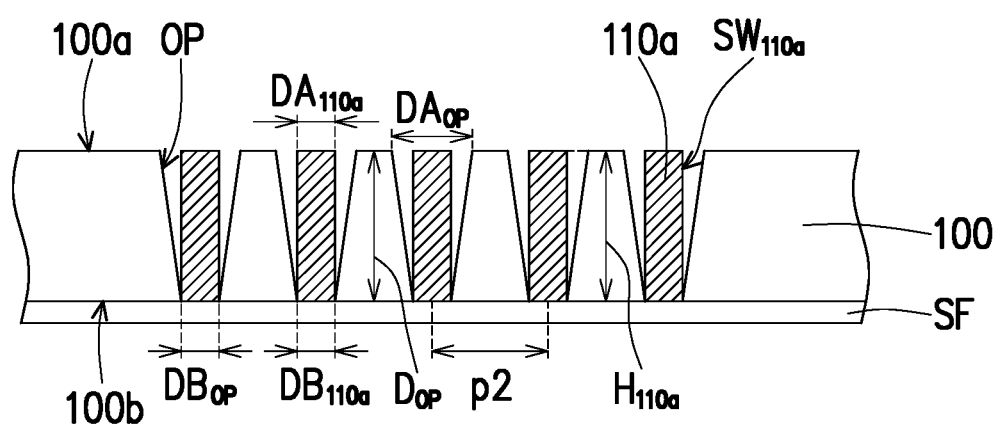

Referring to FIG. 6B, a plurality of TCVs 110a is formed in the openings OP of the insulating body 100. In some embodiments, the TCVs 110a are pre-fabricated and are placed into the openings OP of the insulating body 100. For example, the TCVs 110a are pre-fabricated conductive posts or conductive pillars. In some embodiments, the TCVs 110a are placed to be standing on the sacrificial film SF. The pre-fabricated TCVs 110a may be placed into the openings OP through various processes. These processes will be described below in conjunction with FIG. 7A to FIG. 7D.

FIG. 7A to FIG. 7D are schematic cross-sectional views illustrating various methods for placing the TCVs 110a in the openings OP of the insulating body 100 of FIG. 6B.

Figure 7A:
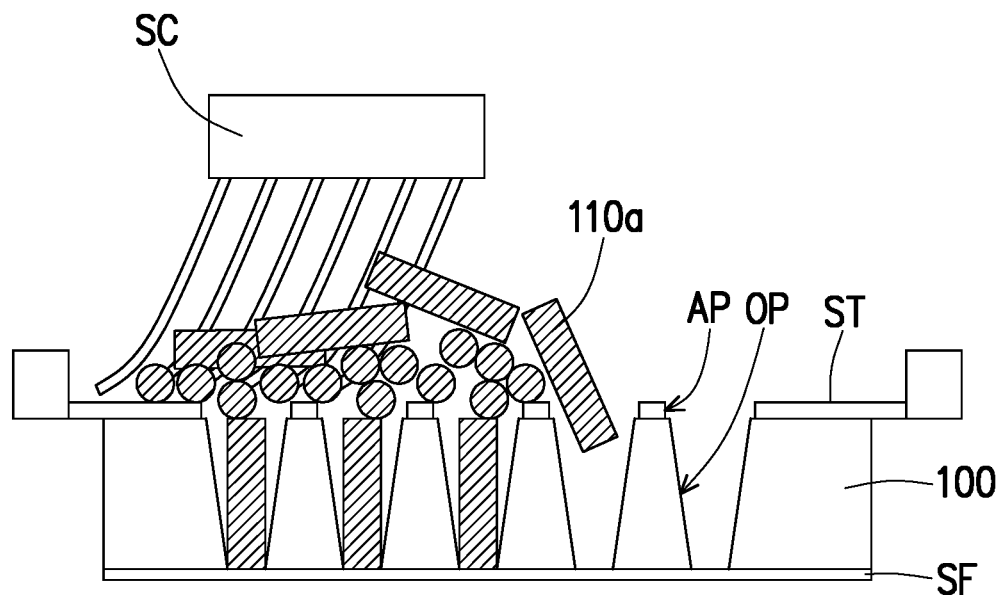
FIG. 7A to FIG. 7D are schematic cross-sectional views illustrating various methods for placing the through carrier vias (TCV) in the openings of the insulating body of FIG. 6B.

Referring to FIG. 7A, a stencil ST is provided over the insulating body 100. In some embodiments, the stencil ST has a plurality of apertures AP, and each aperture AP exposes the corresponding opening OP of the insulating body 100. After the stencil ST is provided, a plurality of pre-fabricated TCVs 110a is placed over the stencil ST. Thereafter, a scraper SC is provided over the stencil ST and the TCVs 110a. In some embodiments, the scraper SC moves along the span of the insulating body 100 and scrapes the TCVs 110a above the stencil ST into the apertures AP of the stencil ST and the openings OP of the insulating body 100 during the movement thereof. For example, the TCVs 110a are able to roll on an upper surface of the stencil ST, and the scraper SC may easily drive the TCVs 110a into the apertures AP of the stencil ST and the openings OP of the insulating body 100.

Figure 7B:
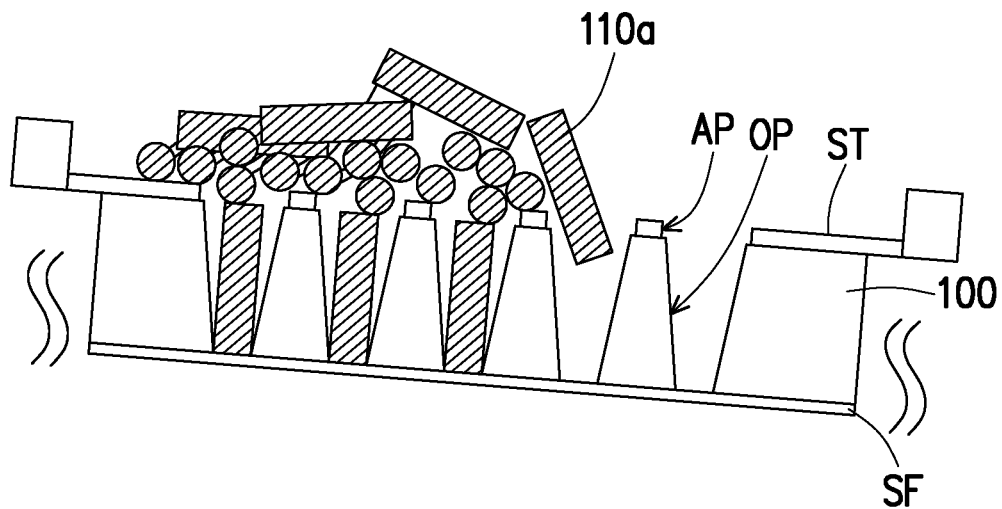

Referring to FIG. 7B, a stencil ST is provided over the insulating body 100. In some embodiments, the stencil ST has a plurality of apertures AP, and each aperture AP exposes the corresponding opening OP of the insulating body 100. After the stencil ST is provided, a plurality of pre-fabricated TCVs 110a is placed over the stencil ST. Thereafter, the insulating body 100 is tilted, so the TCVs 110a are driven into the apertures AP of the stencil ST and the openings OP of the insulating body 100 by gravitational force. For example, the TCVs 110a are able to roll on an upper surface of the stencil ST, and the gravitational force causes the TCVs 110a to fall into the apertures AP of the stencil ST and the openings OP of the insulating body 100. In some embodiments, the insulating body 100 is vibrated while being tilted. In other words, the TCVs 110a are subjected to a specific vibration frequency to further aid the rolling of the TCVs 110a.

Figure 7C:
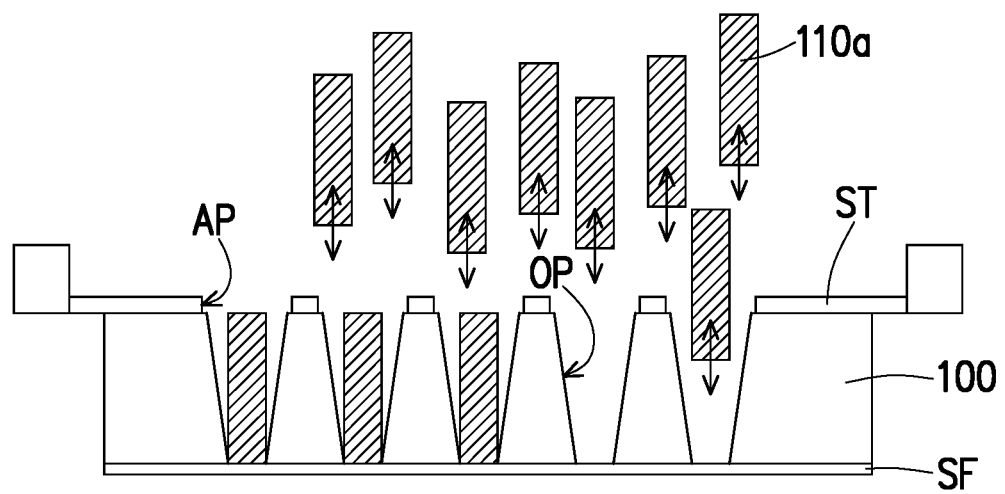

Referring to FIG. 7C, a stencil ST is provided over the insulating body 100. In some embodiments, the stencil ST has a plurality of apertures AP, and each aperture AP exposes the corresponding opening OP of the insulating body 100. After the stencil ST is provided, a plurality of pre-fabricated TCVs 110a is placed over the stencil ST. Thereafter, a suction mechanism (not shown) above the stencil ST and the TCVs 110a is turned on to suck the TCVs 110a upward. After the TCVs 110a are being sucked upward and are floated in the air, the suction mechanism is turned off so the TCVs 110a would drop into the apertures AP of the stencil ST and the openings OP of the insulating body 100 due to the gravitational force. The foregoing process may be repeated multiple times until each opening OP accommodates one TCV 110a.

Figure 7D:
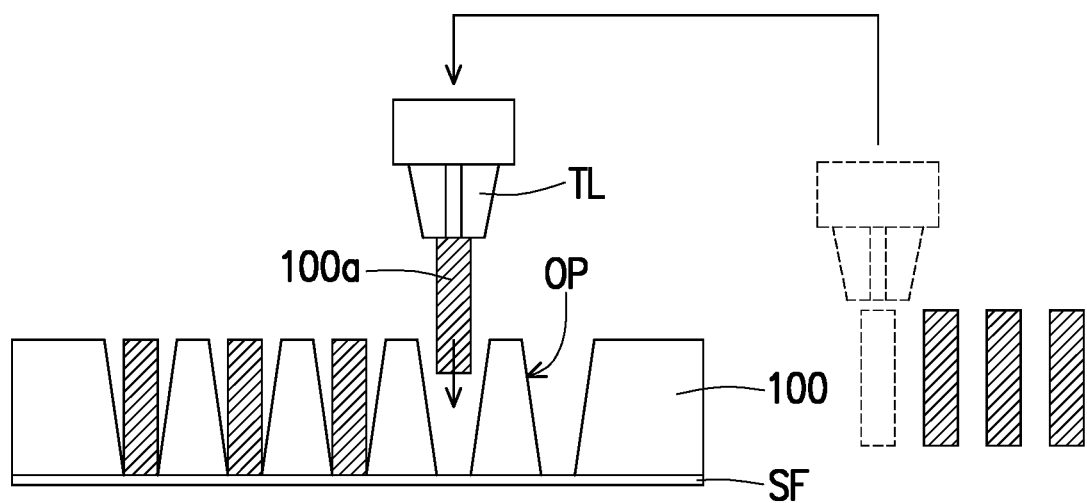

Referring to FIG. 7D, the TCVs 110a are placed into the openings OP of the insulating body 100 through a picked-and-placed process. For example, the pre-fabricated TCVs 110a are being picked up by a placing tool TL one by one, and are being placed into the openings OP of the insulating body 100 through the placing tool TL one by one.

Although the processes of placing the TCVs 110a into the openings OP of the insulating body 100 in FIG. 7A to FIG. 7D are illustrated as individual processes, the disclosure is not limited thereto. In some alternative embodiments, at least two of the processes respectively shown in FIG. 7A to FIG. 7D may be combined to place the TCVs 110a into the openings OP of the insulating body 100.

Referring back to FIG. 6B, a height $H_{110a}$ of each TCV 110a is substantially the same as the depth $D_{OP}$ of each opening OP. In some embodiments, the height $H_{110a}$ of each TCV 110a ranges from about 50 µm to about 1000 µm. In some embodiments, each TCV 110a has a substantially straight sidewall $SW_{110a}$. That is, a first diameter $DA_{110a}$ of each TCV 110a may be substantially equal to a second diameter $DB_{110a}$ of each TCV 110a, and each TCV 110a may be in the form of a cylinder. As illustrated in FIG. 6B, the first diameter $DA_{110a}$ of each TCV 110a is smaller than the first diameter $DA_{OP}$ of each opening OP. Meanwhile, the first diameter $DA_{110a}$ and the second diameter $DB_{110a}$ of each TCV 110a are substantially equal to the second diameter $DB_{OP}$ of each opening OP. However, the disclosure is not limited thereto. In some alternative embodiments, both of the first diameter $DA_{110a}$ and the second diameter $DB_{110a}$ of each TCV 110a is smaller than the first diameter $DA_{OP}$ and the second diameter $DB_{OP}$ of each opening OP. In some embodiments, the first diameter $DA_{110a}$ and the second diameter $DB_{110a}$ range from about 50 µm to about 300 µm. In some embodiments, two adjacent TCVs 110a are formed to have a pitch p2 ranging from about 100 µm to about 1000 µm.

Figure 6C:
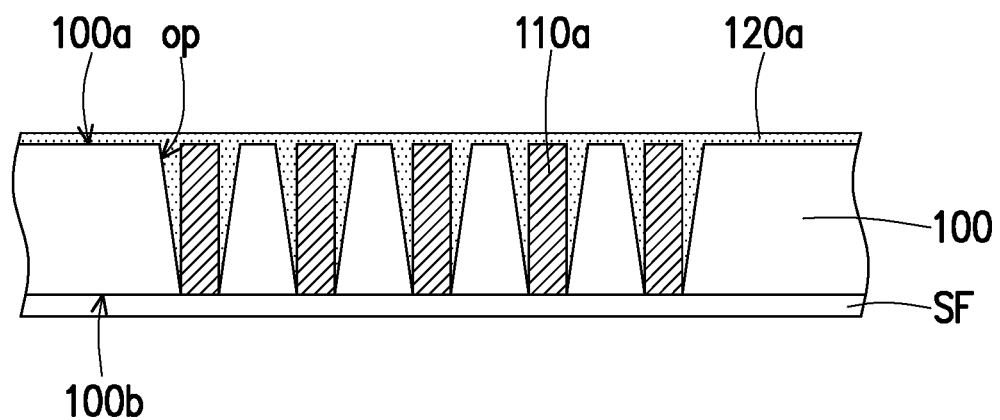

Referring to FIG. 6C, a filling material layer 120a is formed over the insulating body 100. In some embodiments, the filling material layer 120a covers the first surface 100a of the insulating body 100 and fills into the openings OP of the insulating body 100. In some embodiments, the TCVs 110a located in the openings OP of the insulating body 100 are encapsulated by the filling material layer 120a. In other words, the TCVs 110a are not revealed and are well protected by the filling material layer 120a. In some embodiments, the filling material layer 120a is made of organic materials. For example, the filling material layer 120a is made of polymeric materials, such as acetal, acrylic, cellulose, acetate, polyethylene, polystyrene, vinyl, nylon, polyolefin, polyester, silicone, paraffin, or a combination thereof. In some alternative embodiments, the filling material layer 120a is made of a molding compound. When the filling material layer 120a is made of a molding compound, the filling material layer 120a may further include fillers. The fillers may be particles made of silica, aluminum dioxide, or the like. In some embodiments, the filling material layer 120a is formed through atomic layer deposition (ALD), chemical vapor deposition (CVD), plasma enhanced chemical vapor deposition (PECVD), high density plasma chemical vapor deposition (HDPCVD), physical vapor deposition (PVD), or the like. Alternatively, the filling material layer 120a may be formed through a transfer molding process, a compression molding process, or any other suitable molding processes. In some embodiments, a Young's modulus of the filling material layer 120a ranges from about 3 GPa to about 30 GPa. For example, when the filling material layer 120a is made of a polymeric material, the Young's modulus thereof ranges from about 3 GPa to about 5 GPa. Alternatively, when the filling material layer 120a is made of a molding compound, the Young's modulus thereof ranges from about 15 GPa to about 30 GPa.

Figure 6D:
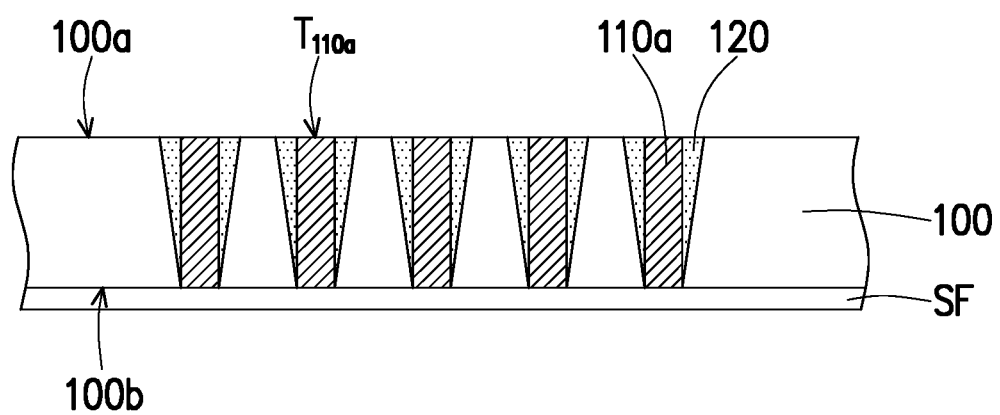

Referring to FIG. 6C and FIG. 6D, a portion of the filling material layer 120a is removed to form a plurality of filling patterns 120 in the openings OP of the insulating body 100. In some embodiments, the portion of the filling material layer 120a is removed until the top surfaces $T_{110a}$ of the TCVs 110a are exposed. For example, the filling material layer 120a above the first surface 100a of the insulating body 100 is removed to form the filling patterns 120. In some embodiments, the portion of the filling material layer 120a is removed through a planarization process, an etching process, or the like. The planarization process includes, for example, a CMP process, a mechanical grinding process, or the like. The etching process includes, for example, an anisotropic etching process such as dry etch or an isotropic etching process such as wet etch. In some embodiments, the filling patterns 120 are sandwiched between each TCV 110a and the insulating body 100.

Figure 6E:
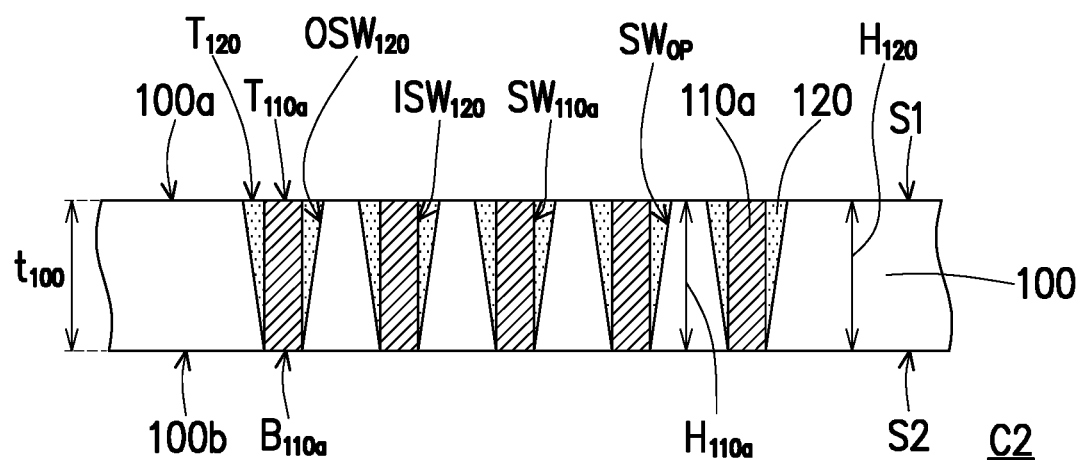

Referring to FIG. 6D and FIG. 6E, the sacrificial film SF is removed to expose the second surface 100b of the insulating body 100, so as to obtain a carrier substrate C2.

In some embodiments, the sacrificial film SF is removed through an etching process, a stripping process, or the like. In some embodiments, the carrier substrate C2 includes the insulating body 100, the TCVs 110a, and the filling patterns 120. The TCVs 110a are embedded in the insulating body 100 and the filling patterns 120. For example, each filling pattern 120 laterally encapsulates the corresponding TCV 110a, and the insulating body 100 laterally encapsulates the filling patterns 120. In some embodiments, the insulating body 100 and the filling patterns 120 are made of different materials. As illustrated in FIG. 6E, each TCV 110a and each filling pattern 120 penetrate through the insulating body 100. In other words, the height $H_{110a}$ of each TCV 110a and a height $H_{120}$ of each filling pattern 120 are substantially equal to the thickness $t_{100}$ of the insulating body 100. For example, the height $H_{110a}$ of each TCV 110a and the height $H_{120}$ of each filling pattern 120 range from about 50 µm to about 1000 µm.

As illustrated in FIG. 6E, each filling pattern 120 is sandwiched between each TCV 110a and the insulating body 100. In other words, the filling patterns 120 are in physical contact with the insulating body 100 and the TCVs 110a. In some embodiments, since the filling patterns 120 are formed by filling gaps between the openings OP of the insulating body 100 and the TCVs 110a, the geometry and the shape of the filling patterns 120 depend on the geometries and the shapes of the openings OP and the TCVs 110a. For example, an inner sidewall $ISW_{120}$ of each filling pattern 120 follows a profile of the sidewall $SW_{110a}$ of the corresponding TCV 110a in which the filling pattern 120 is in physical contact with. Similarly, an outer sidewall $OSW_{120}$ of each filling pattern 120 follows a profile of the sidewall $SW_{OP}$ of the corresponding opening OP of the insulating body 100. In other words, each filling pattern 120 has an inner sidewall $ISW_{120}$ contacting the corresponding TCV 110a and an outer sidewall $OSW_{120}$ contacting the insulating body 100. As mentioned above, each TCV 110a has a substantially straight sidewall $SW_{110a}$. Since the inner sidewall $ISW_{120}$ of the filling pattern 120 follows the profile of the sidewall $SW_{110a}$ of the TCV 110a, the inner sidewall $ISW_{120}$ of each filling pattern 120 is also substantially straight. On the other hand, as mentioned above, each opening OP of the insulating body 100 has a slanted sidewall $SW_{OP}$. Since the outer sidewall $OSW_{120}$ of the filling pattern 120 follows the profile of the sidewall $SW_{OP}$ of the openings, the outer sidewall $OSW_{120}$ of each filling pattern 120 is slanted. In some embodiments, a Young's modulus of the filling patterns 120 ranges from about 3 GPa to about 30 GPa. For example, when the filling patterns 120 is made of a polymeric material, the Young's modulus thereof ranges from about 3 GPa to about 5 GPa. Alternatively, when the filling patterns 120 is made of a molding compound, the Young's modulus thereof ranges from about 15 GPa to about 30 GPa.

As illustrated in FIG. 6E, top surfaces $T_{110a}$ of the TCVs 110a and top surfaces $T_{120}$ of the filling patterns 120 are substantially coplanar with the first surface 100a of the insulating body 100. Similarly, bottom surfaces $B_{110}$ of the TCVs 110 are substantially coplanar with the second surface 100b of the insulating body 100. In some embodiments, the top surfaces $T_{110}$ of the TCVs 110, the top surfaces $T_{120}$ of the filling patterns 120, and the first surface 100a of the insulating body 100 are collectively referred to as a first surface S1 of the carrier substrate C2. On the other hand, the bottom surface $B_{110}$ of the TCVs 110 and the second surface 100b of the insulating body 100 are collectively referred to as a second surface S2 of the carrier substrate C2. As mentioned above, the second diameter $DB_{110a}$ of each TCV 110a is substantially equal to the second diameter $DB_{OP}$ of each opening OP of the insulating body 100. As such, the filling patterns 120 are not exposed at the second surface 100b of the insulating body 100 (i.e. not exposed at the second surface S2 of the carrier substrate C2). However, the disclosure is not limited thereto. In some alternative embodiments, when the second diameter $DB_{110a}$ of the TCV 110a is smaller than the second diameter $DB_{OP}$ of the opening OP of the insulating body 100, bottom surfaces of the filling patterns 120 would be exposed at the second surface 100b of the insulating body 100. Under this scenario, the bottom surface of the filling patterns 120 may be included as part of the second surface S2 of the carrier substrate C2. In some embodiments, the first surface S1 of the carrier substrate C2 is opposite to the second surface S2 of the carrier substrate C2.

As mentioned above, the TCVs 110a are pre-fabricated and are placed in the openings OP of the insulating body 100. The pre-fabricated TCVs 110a are able to achieve higher electrical conductivity, higher throughput, as well as higher quality (i.e. free of voids within the TCVs 110). As such, the overall cost for manufacturing the carrier substrate C2 may be effectively reduced and the quality of the carrier substrate C2 may be ensured.

FIG. 8A to FIG. 8E are schematic cross-sectional views illustrating a manufacturing process of a carrier substrate C2 in accordance with some alternative embodiments of the disclosure.

Figure 8A:
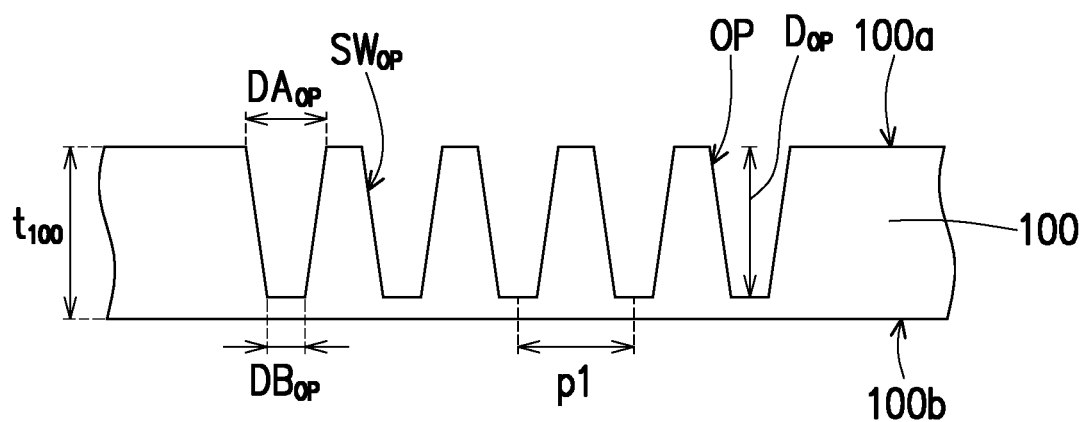
FIG. 8A to FIG. 8E are schematic cross-sectional views illustrating a manufacturing process of a carrier substrate in accordance with some alternative embodiments of the disclosure.

Referring to FIG. 8A, an insulating body 100 is provided. The insulating body 100 in FIG. 8A is similar to the insulating body 100 in FIG. 6A, so the detailed description thereof is omitted herein. However, as illustrated in FIG. 8A, the openings OP do not penetrate through the insulating body 100. For example, the depth $D_{OP}$ of each opening OP is smaller than the thickness $t_{100}$ of the insulating body 100. Moreover, the sacrificial film in FIG. 6A is omitted in FIG. 8A. In other words, the second surface 100b of the insulating body 100 is exposed in FIG. 8A.

Figure 8B:
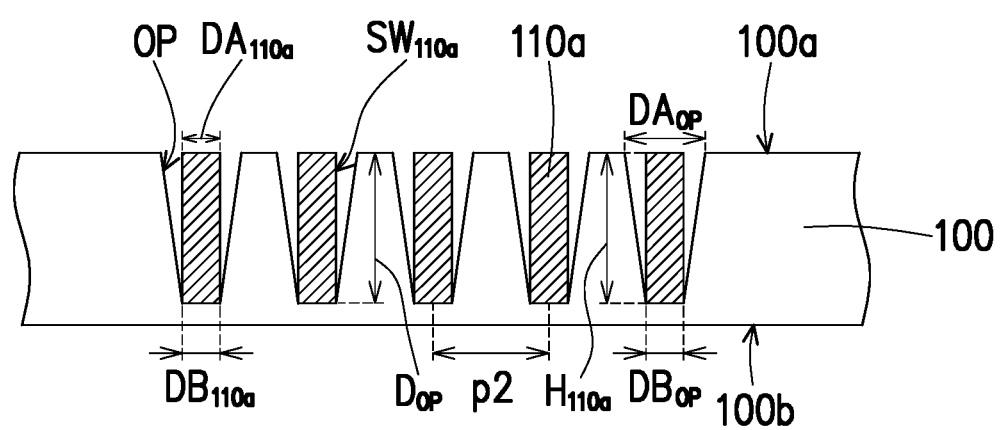
Figure 8C:
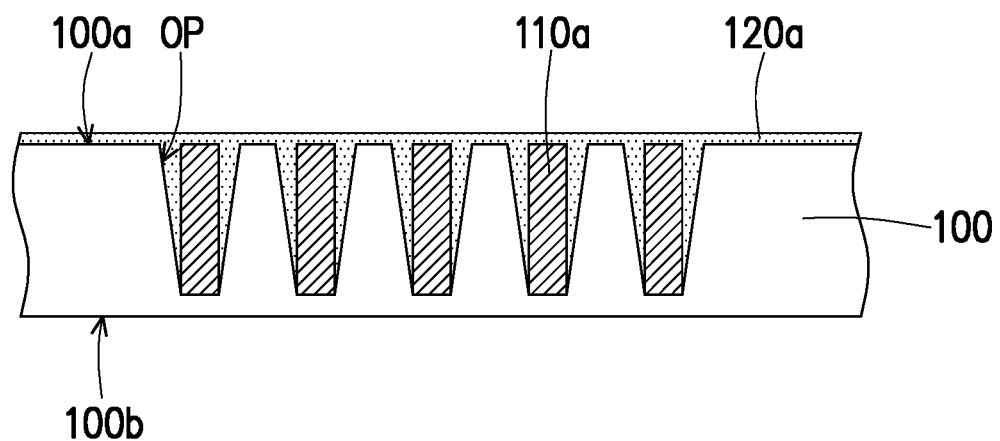
Figure 8D:
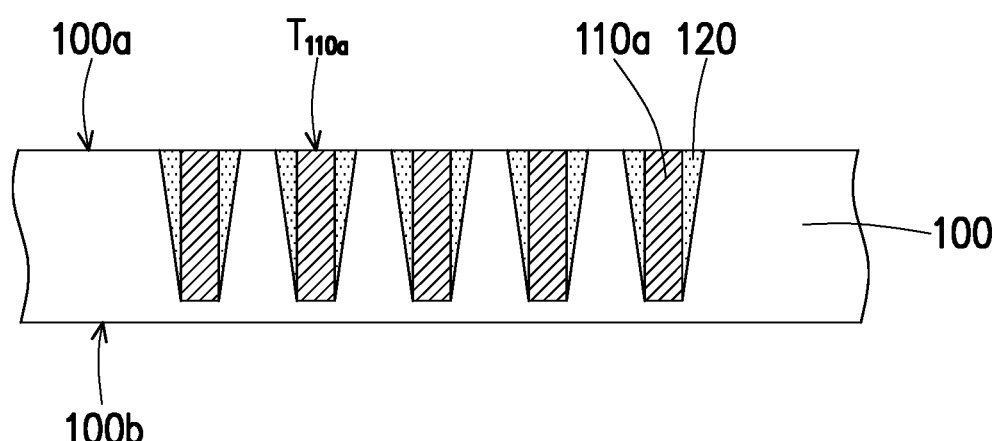

Referring to FIG. 8B to FIG. 8D, the steps illustrated in FIG. 8B to FIG. 8D are similar to the steps illustrated in FIG. 6B to FIG. 6D, so the detailed descriptions thereof are omitted herein.

Figure 8E:
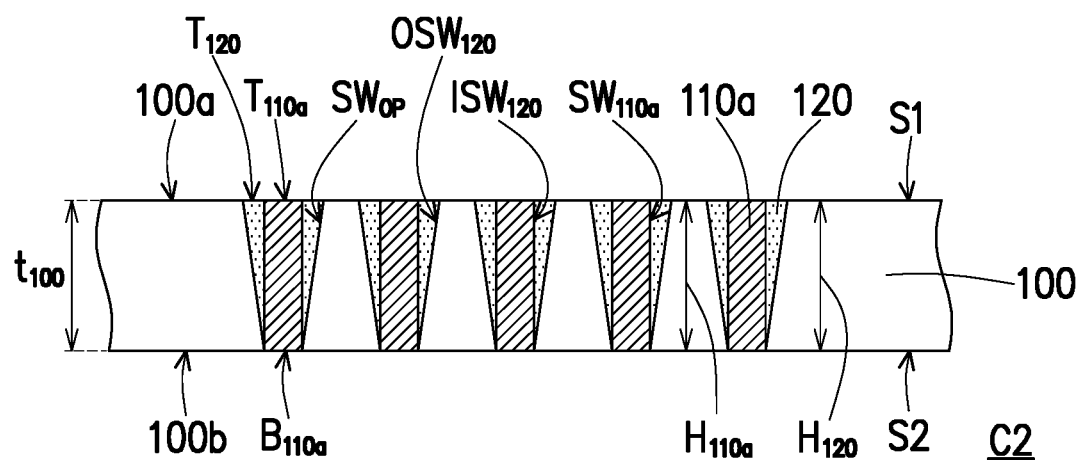

Referring to FIG. 8D and FIG. 8E, a portion of the insulating body 100 is removed to expose the bottom surfaces $B_{110a}$ of the TCVs 110a, so as to obtain a carrier substrate C2. For example, a planarization process or an etching process is performed on the insulating body 100 from the second surface 100b shown in FIG. 8D until the bottom surfaces $B_{110a}$ of the TCVs 110a are exposed. The planarization process includes, for example, a CMP process, a mechanical grinding process, or the like. The etching process includes, for example, an anisotropic etching process such as dry etch or an isotropic etching process such as wet etch. In some embodiments, the TCVs 110a may be slightly planarized or etched from the bottom surfaces $B_{110a}$ thereof to further reduce the overall thickness of the carrier substrate C2. It should be noted that although FIG. 6A to FIG. 6E and FIG. 8A to FIG. 8E illustrated two different methods of manufacturing the carrier substrate C2, the structure of the carrier substrate C2 obtained through these two methods may be substantially the same.

In some embodiments, the carrier substrate C2 may be utilized in various application. For example, the carrier substrate C2 may be incorporate into various package structures to serve as a supporting mechanism which also provides electrical path. The applications of the carrier substrate C2 will be described below in conjunction with FIG. 9 to FIG. 11.

Figure 9:
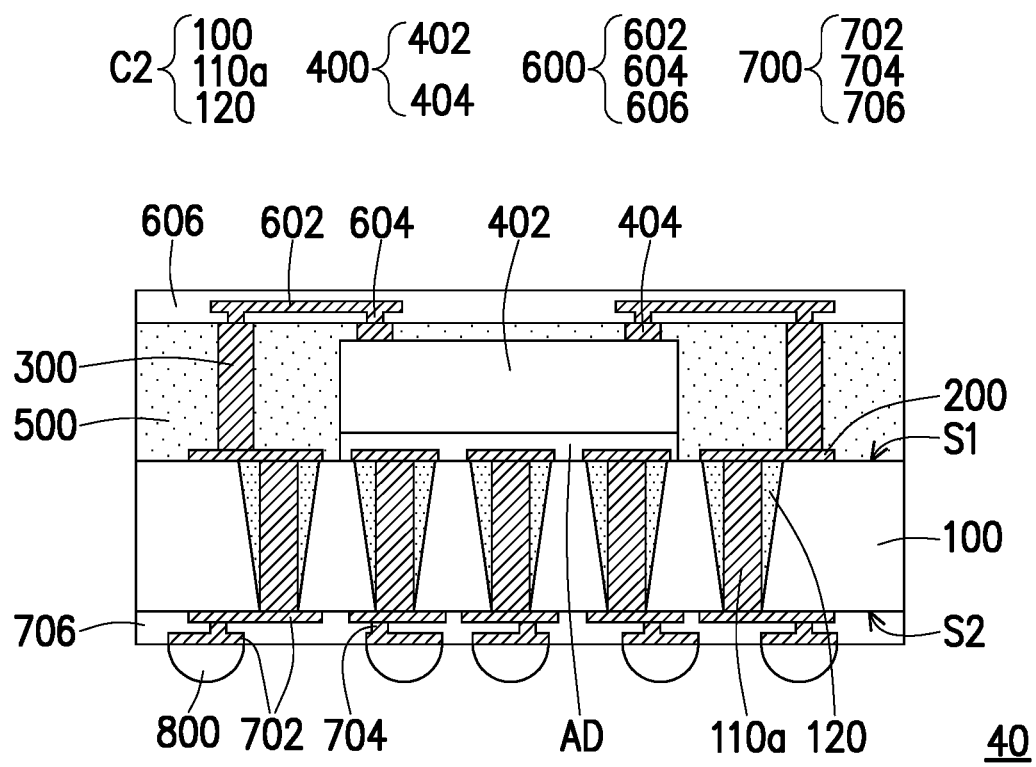
FIG. 9 is a schematic cross-sectional view illustrating a package structure in accordance with some alternative embodiments of the disclosure.

FIG. 9 is a schematic cross-sectional view illustrating a package structure 40 in accordance with some alternative embodiments of the disclosure. Referring to FIG. 9, the package structure 40 in FIG. 9 is similar to the package structure 10 in FIG. 3G, so similar elements are denoted by the same reference numeral, and the detailed descriptions thereof are omitted herein. The difference between the package structure 40 of FIG. 9 and the package structure 10 in FIG. 3G lies in that the carrier substrate C1 in FIG. 3G is replaced by the carrier substrate C2 in FIG. 9. That is, the carrier substrate C2 in FIG. 6E and FIG. 8E is incorporated into the package structure 40 of FIG. 9. As illustrated in FIG. 9, the TCVs 110a and the filling patterns 120 of the carrier substrate C2 are in physical contact with the routing patterns 200. In other words, the TCVs 110a are well protected by the filling patterns 120 and are able to render electrical connection between the first surface S1 and the second surface S2 of the carrier substrate C2 (i.e. between the die 400 and the redistribution structure 700 and between the TIVs 300 and the redistribution structure 700).

Figure 10:
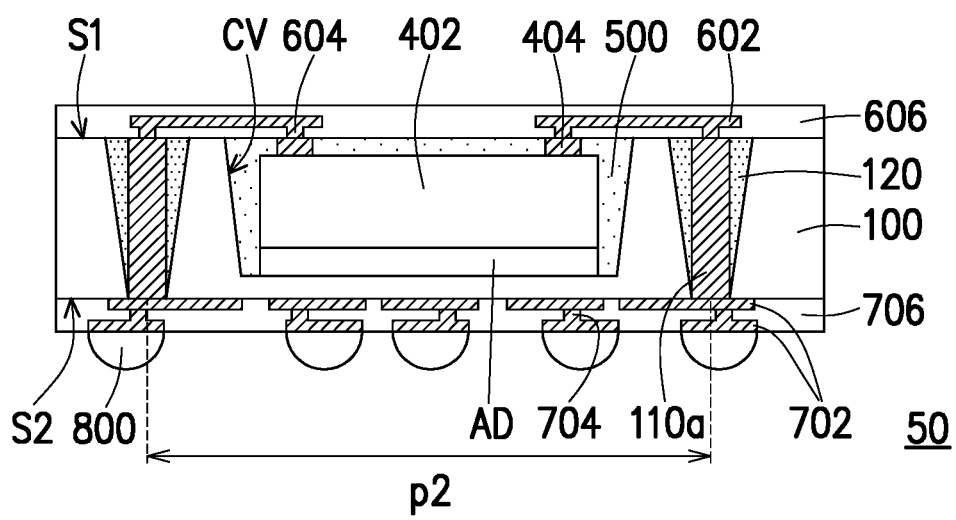
FIG. 10 is a schematic cross-sectional view illustrating a package structure in accordance with some alternative embodiments of the disclosure.

FIG. 10 is a schematic cross-sectional view illustrating a package structure 50 in accordance with some alternative embodiments of the disclosure. Referring to FIG. 10, the package structure 50 in FIG. 10 is similar to the package structure 20 in FIG. 4G, so similar elements are denoted by the same reference numeral, and the detailed descriptions thereof are omitted herein. The difference between the package structure 50 of FIG. 10 and the package structure 20 in FIG. 4G lies in that the carrier substrate C1' in FIG. 4G is replaced by the carrier substrate C2' in FIG. 10. In some embodiments, the carrier substrate C2' in FIG. 10 is similar to the carrier substrate C2 in FIG. 6E and FIG. 8E, so the detailed description thereof is omitted herein. The difference between the carrier substrate C2' in FIG. 10 and the carrier substrate C2 in FIG. 6E and FIG. 8E is that a pitch p2 between two adjacent TCVs 110a in the carrier substrate C2' of FIG. 10 is larger than the pitch p2 between two adjacent TCVs 110a in the carrier substrate C2 of FIG. 6E and FIG. 8E. Moreover, a cavity CV is formed in the insulating body 100. As illustrated in FIG. 10, the filling patterns 120 of the carrier substrate C2' are in physical contact with the redistribution structure 600. For example, the filling patterns 120 of the carrier substrate C2' are in physical contact with the dielectric layer 606 of the redistribution structure 600. In some embodiments, the TCVs 110a are well protected by the filling patterns 120 and are able to render electrical connection between the first surface S1 and the second surface S2 of the carrier substrate C2' (i.e. between the die 400 and the redistribution structure 700).

Figure 11:
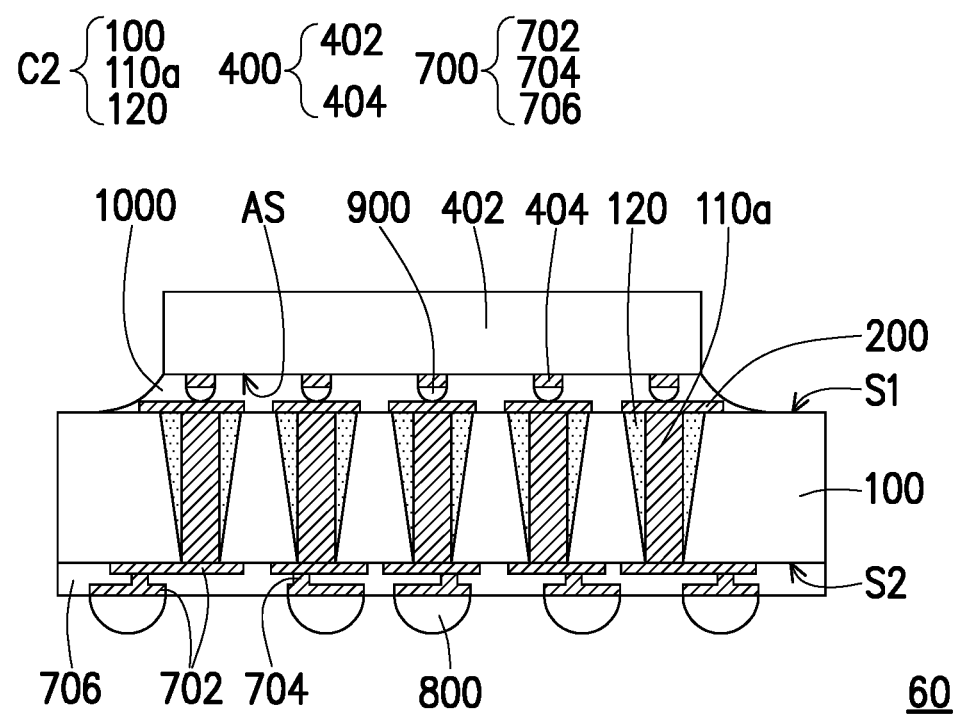
FIG. 11 is a schematic cross-sectional view illustrating a package structure in accordance with some alternative embodiments of the disclosure.

FIG. 11 is a schematic cross-sectional view illustrating a package structure 60 in accordance with some alternative embodiments of the disclosure. Referring to FIG. 11, the package structure 60 in FIG. 11 is similar to the package structure 30 in FIG. 5, so similar elements are denoted by the same reference numeral, and the detailed descriptions thereof are omitted herein. The difference between the package structure 60 of FIG. 11 and the package structure 30 in FIG. 5 lies in that the carrier substrate C1 in FIG. 5 is replaced by the carrier substrate C2 in FIG. 11. That is, the carrier substrate C2 in FIG. 6E and FIG. 8E is incorporated into the package structure 60 of FIG. 11. As illustrated in FIG. 11, the TCVs 110a and the filling patterns 120 of the carrier substrate C2 are in physical contact with the routing patterns 200. In other words, the TCVs 110a are well protected by the filling patterns 120 and are able to render electrical connection between the first surface S1 and the second surface S2 of the carrier substrate C2 (i.e. between the die 400 and the redistribution structure 700).

Figure 12A:
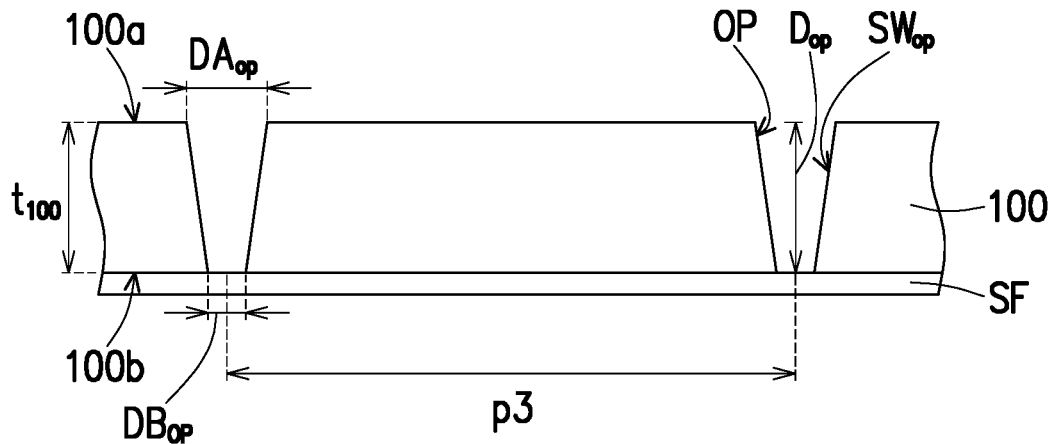
FIG. 12A to FIG. 12E are schematic cross-sectional views illustrating a manufacturing process of a carrier substrate in accordance with some alternative embodiments of the disclosure.

FIG. 12A to FIG. 12E are schematic cross-sectional views illustrating a manufacturing process of a carrier substrate C3 in accordance with some alternative embodiments of the disclosure. Referring to FIG. 12A, an insulating body 100 is provided on a sacrificial film SF. In some embodiments, the insulating body 100 and the sacrificial film SF in FIG. 12A are respectively similar to the insulating body 100 and the sacrificial film SF in FIG. 6A, so the detailed descriptions thereof are omitted herein. However, in FIG. 12A, a pitch p3 between two adjacent openings OP is larger than the pitch p1 between two adjacent openings OP in FIG. 6A.

Figure 12B:
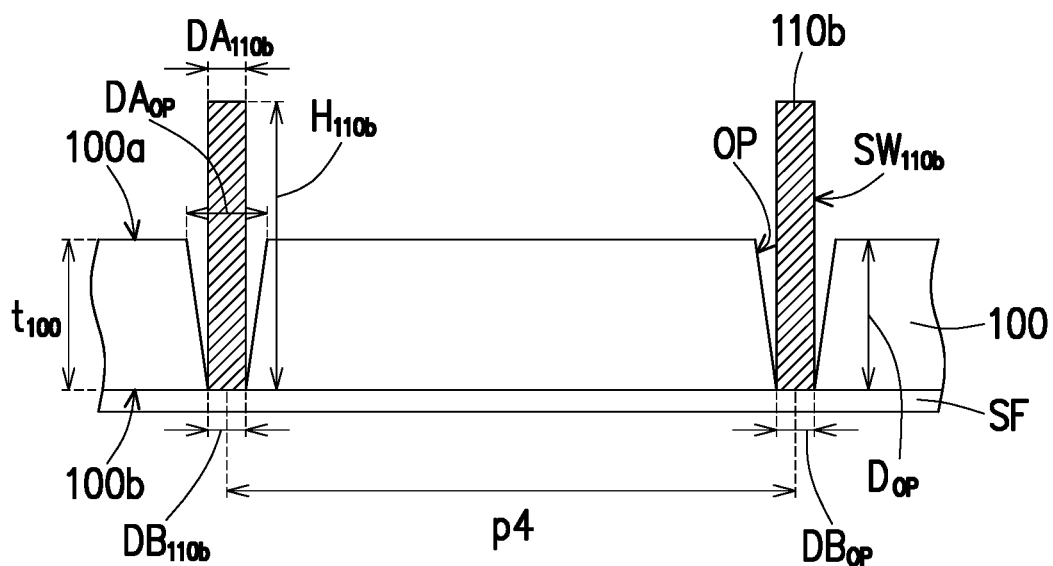

Referring to FIG. 12B, a plurality of TCVs 110b is formed in the openings OP of the insulating body 100. The formation method and the material of the TCVs 110b in FIG. 12B are similar to that of the TCVs 110a in FIG. 6B, so the detailed descriptions thereof are omitted herein. Referring to FIG. 12B, a height $H_{110b}$ of each TCV 110b is larger than the depth $D_{OP}$ of each opening OP. That is, each TCV 110b is partially located in the corresponding opening OP and protrudes from the openings OP of the insulating body 100. For example, each TCV 110b protrudes above the first surface 100a of the insulating body 100. In some embodiments, the height $H_{110b}$ of each TCV 110b ranges from about 100 μm to about 1000 μm. In some embodiments, each TCV 110b has a substantially straight sidewall $SW_{110b}$. That is, a first diameter $DA_{110b}$ of each TCV 110b may be substantially equal to a second diameter $DB_{110b}$ of each TCV 110b, and each TCV 110b may be in the form of a cylinder. As illustrated in FIG. 12B, the first diameter $DA_{110b}$ of each TCV 110b is smaller than the first diameter $DA_{OP}$ of each opening OP. Meanwhile, the first diameter $DA_{110b}$ and the second diameter $DB_{110b}$ of each TCV 110b are substantially equal to the second diameter $DB_{OP}$ of each opening OP. However, the disclosure is not limited thereto. In some alternative embodiments, both of the first diameter $DA_{110b}$ and the second diameter $DB_{110b}$ of each TCV 110b is smaller than the first diameter $DA_{OP}$ and the second diameter $DB_{OP}$ of each opening OP. In some embodiments, the first diameter $DA_{110b}$ and the second diameter $DB_{110b}$ range from about 50 μm to about 300 μm. That is, an aspect ratio (i.e. a ratio of the height $H_{110b}$ and the first diameter $DA_{110b}$/the second diameter $DB_{110b}$) ranges from about 1 to about 10. In some embodiments, a pitch p4 between two adjacent TCVs 110b is substantially equal to the pitch p3 between two adjacent openings OP (shown in FIG. 12A).

Figure 12C:
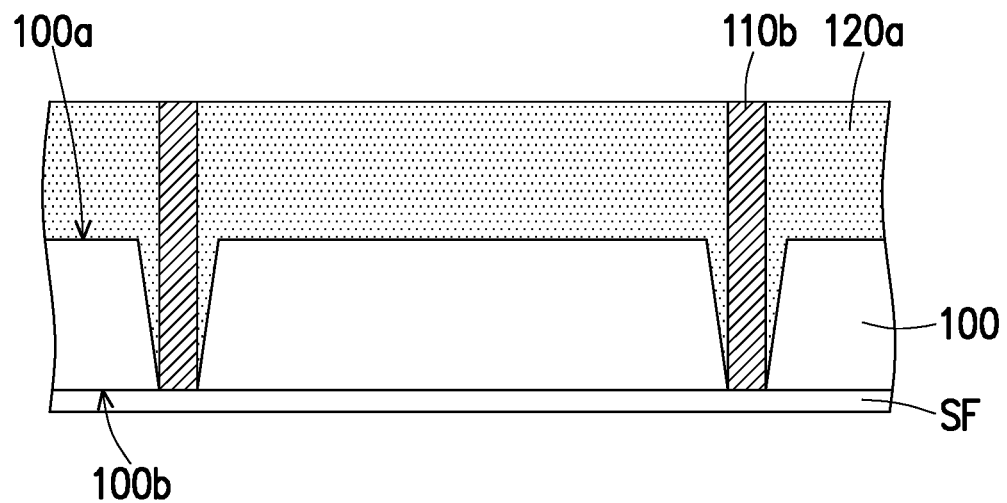

Referring to FIG. 12C, a filling material layer 120a is formed over the insulating body 100. The formation method and the material of the filling material layer 120a in FIG. 12C are similar to that of the filling material layer 120a in FIG. 6C, so the detailed descriptions thereof are omitted herein. In some embodiments, the filling material layer 120a covers the first surface 100a of the insulating body 100 and fills into the openings OP of the insulating body 100. In some embodiments, the TCVs 110b are laterally encapsulated by the filling material layer 120a.

Figure 12D:
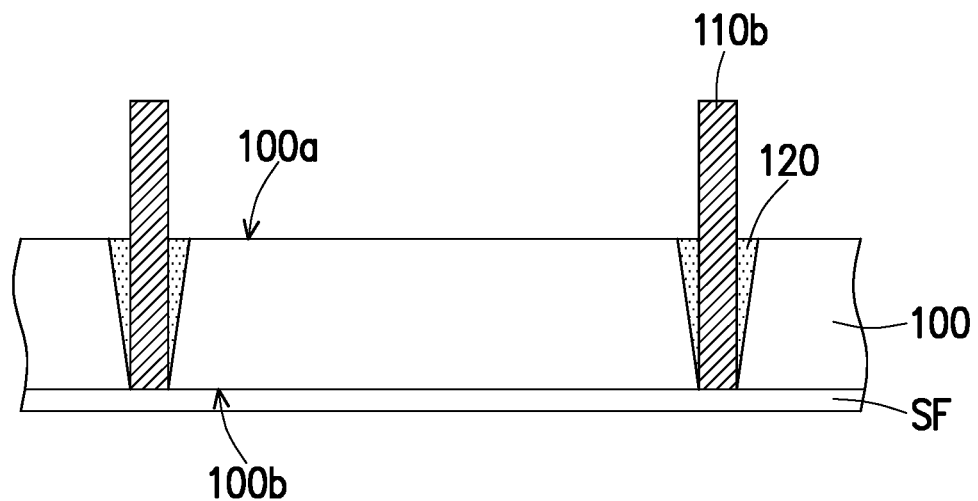

Referring to FIG. 12C and FIG. 12D, a portion of the filling material layer 120a is removed to form a plurality of filling patterns 120 in the openings OP of the insulating body 100. In some embodiments, the portion of the filling material layer 120a is removed until the first surface 100a of the insulating body 100 is exposed. For example, the filling material layer 120a above the first surface 100a of the insulating body 100 is removed to form the filling patterns 120. In some embodiments, the portion of the filling material layer 120a is removed through a planarization process, an etching process, or the like. The planarization process includes, for example, a CMP process, a mechanical grinding process, or the like. The etching process includes, for example, an anisotropic etching process such as dry etch or an isotropic etching process such as wet etch. In some embodiments, the filling patterns 120 are sandwiched between each TCV 110b and the insulating body 100. In other words, the TCVs 110b protrude from the filling patterns 120.

Figure 12E:
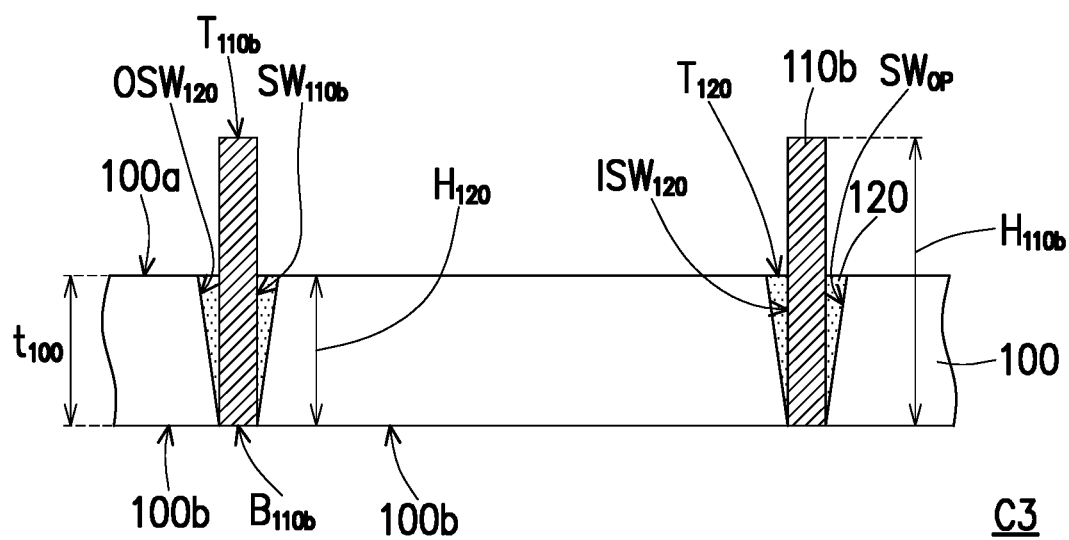

Referring to FIG. 12D and FIG. 12E, the sacrificial film SF is removed to expose the second surface 100b of the insulating body 100, so as to obtain a carrier substrate C3. In some embodiments, the sacrificial film SF is removed through an etching process, a stripping process, or the like. In some embodiments, the carrier substrate C3 includes the insulating body 100, the TCVs 110b, and the filling patterns 120. The TCVs 110b are partially embedded in the insulating body 100 and the filling patterns 120. For example, each filling pattern 120 laterally encapsulates a portion of the corresponding TCV 110b, and the insulating body 100 laterally encapsulates the filling patterns 120. In some embodiments, the insulating body 100 and the filling patterns 120 are made of different materials. As illustrated in FIG. 12E, each filling pattern 120 penetrates through the insulating body 100. In other words, a height $H_{120}$ of each filling pattern 120 is substantially equal to the thickness $t_{100}$ of the insulating body 100. On the other hand, each TCV 110b not only penetrates through the insulating body 100, but also protrudes out above the first surface 100a of the insulating body 100. That is, the height $H_{110b}$ of each TCV 110b is larger than the thickness $t_{100}$ of the insulating body 100.

As illustrated in FIG. 12E, each filling pattern 120 is sandwiched between each TCV 110b and the insulating body 100. In other words, the filling patterns 120 are in physical contact with the insulating body 100 and the TCVs 110b. In some embodiments, since the filling patterns 120 are formed by filling gaps between the openings OP of the insulating body 100 and the TCVs 110b, the geometry and the shape of the filling patterns 120 depend on the geometries and the shapes of the openings OP and the TCVs 110b. For example, an inner sidewall $ISW_{120}$ of each filling pattern 120 follows a profile of the sidewall $SW_{110b}$ of the corresponding TCV 110b in which the filling pattern 120 is in physical contact with. Similarly, an outer sidewall $OSW_{120}$ of each filling pattern 120 follows a profile of the sidewall $SW_{OP}$ of the corresponding opening OP of the insulating body 100. In other words, each filling pattern 120 has an inner sidewall $ISW_{120}$ contacting the corresponding TCV 110b and an outer sidewall $OSW_{120}$ contacting the insulating body 100. As mentioned above, each TCV 110b has a substantially straight sidewall $SW_{110b}$. Since the inner sidewall $ISW_{120}$ of the filling pattern 120 follows the profile of the sidewall $SW_{110b}$ of the TCV 110b, the inner sidewall $ISW_{120}$ of each filling pattern 120 is also substantially straight. On the other hand, each opening OP of the insulating body 100 has a slanted sidewall $SW_{OP}$ (shown in FIG. 12A). Since the outer sidewall $OSW_{120}$ of the filling pattern 120 follows the profile of the sidewall $SW_{OP}$ of the openings, the outer sidewall $OSW_{120}$ of each filling pattern 120 is slanted. In some embodiments, a Young's modulus of the filling patterns 120 ranges from about 3 GPa to about 30 GPa. For example, when the filling patterns 120 is made of a polymeric material, the Young's modulus thereof ranges from about 3 GPa to about 5 GPa. Alternatively, when the filling patterns 120 is made of a molding compound, the Young's modulus thereof ranges from about 15 GPa to about 30 GPa.

As illustrated in FIG. 12E, top surfaces $T_{120}$ of the filling patterns 120 are substantially coplanar with the first surface 100a of the insulating body 100. However, the top surfaces $T_{110b}$ of the TCVs 110b are located at a level height higher than that of the top surfaces $T_{120}$ of the filling patterns 120 and the first surface 100a of the insulating body 100. On the other hand, bottom surfaces $B_{110}$ of the TCVs 110 are substantially coplanar with the second surface 100b of the insulating body 100. As mentioned above, the second diameter $DB_{110b}$ of each TCV 110b is substantially equal to the second diameter $DB_{OP}$ of each opening OP of the insulating body 100. As such, the filling patterns 120 are not exposed at the second surface 100b of the insulating body 100. However, the disclosure is not limited thereto. In some alternative embodiments, when the second diameter $DB_{110b}$ of the TCV 110b is smaller than the second diameter $DB_{OP}$ of the opening OP of the insulating body 100, bottom surfaces of the filling patterns 120 would be exposed at the second surface 100b of the insulating body 100.

In some embodiments, the TCVs 110b are pre-fabricated and are placed in the openings OP of the insulating body 100. The pre-fabricated TCVs 110b are able to achieve higher electrical conductivity, higher through put, as well as higher quality (i.e. free of voids within the TCVs 110). As such, the overall cost for manufacturing the carrier substrate C3 may be effectively reduced and the quality of the carrier substrate C3 may be ensured.

In some embodiments, the carrier substrate C3 may be utilized in various application. For example, the carrier substrate C3 may be incorporate into various package structures to serve as a supporting mechanism which also provides electrical path. The applications of the carrier substrate C3 will be described below in conjunction with FIG. 13A to FIG. 13F, FIG. 14, and FIG. 15.

Figure 13A:
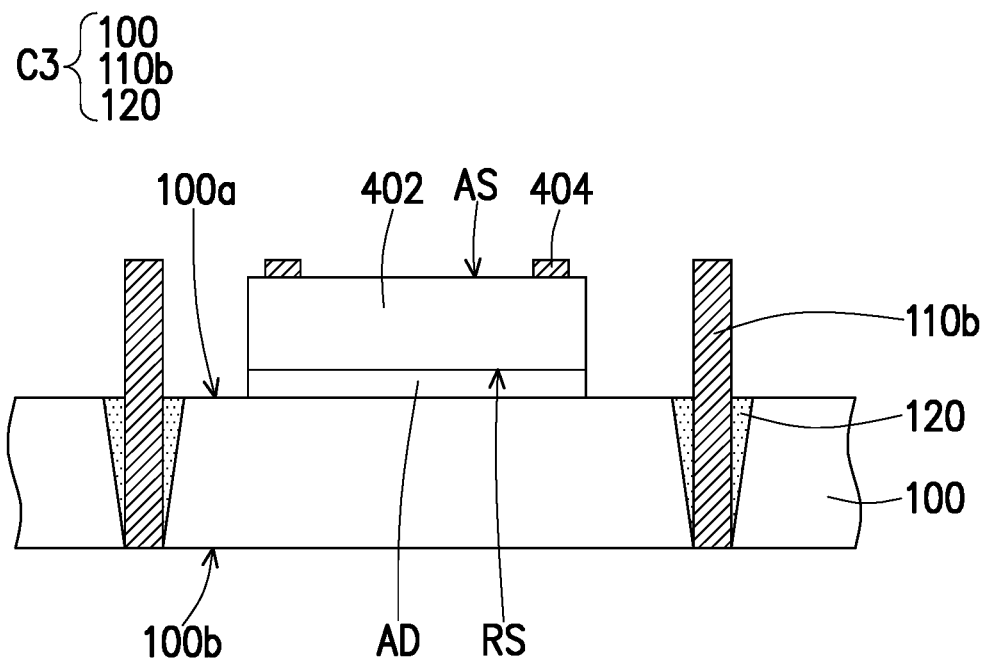
FIG. 13A to FIG. 13F are schematic cross-sectional views illustrating a manufacturing process of a package structure in accordance with some alternative embodiments of the disclosure.

FIG. 13A to FIG. 13F are schematic cross-sectional views illustrating a manufacturing process of a package structure 70 in accordance with some alternative embodiments of the disclosure. Referring to FIG. 13A, the carrier substrate C3 in FIG. 12E is provided. Thereafter, a die 400 is disposed over the carrier substrate C3. For example, the die 400 is disposed on the first surface 100a of the insulating body 100. In some embodiments, the die 400 is disposed through a pick-and-place process or the like. In some embodiments, the die 400 is disposed between the TCVs 110b. For example, as illustrated in FIG. 13A, the die 400 is surrounded by the protruding portions of the TCVs 110b. In some embodiments, the die 400 is attached to the carrier substrate C3 through an adhesive layer AD. For example, the adhesive layer AD is sandwiched between the die 400 and the first surface 100a of the insulating body 100 to fix the die 400 in place. In some embodiments, each die 400 includes a semiconductor substrate 402 and a plurality of conductive posts 404. In some embodiments, the semiconductor substrate 402 and the conductive posts 404 in FIG. 13A are respectively similar to the semiconductor substrate 402 and the conductive posts 404 in FIG. 3B, so the detailed descriptions thereof are omitted herein. In some embodiments, the die 400 has an active surface AS and a rear surface RS opposite to the active surface AS. As illustrated in FIG. 13A, the rear surface RS of the die 400 is attached to the adhesive layer AD while the active surface AS of the die 400 faces upward. In some embodiments, the active surface AS of the die 400 is exposed to atmospheric environment.

Figure 13B:
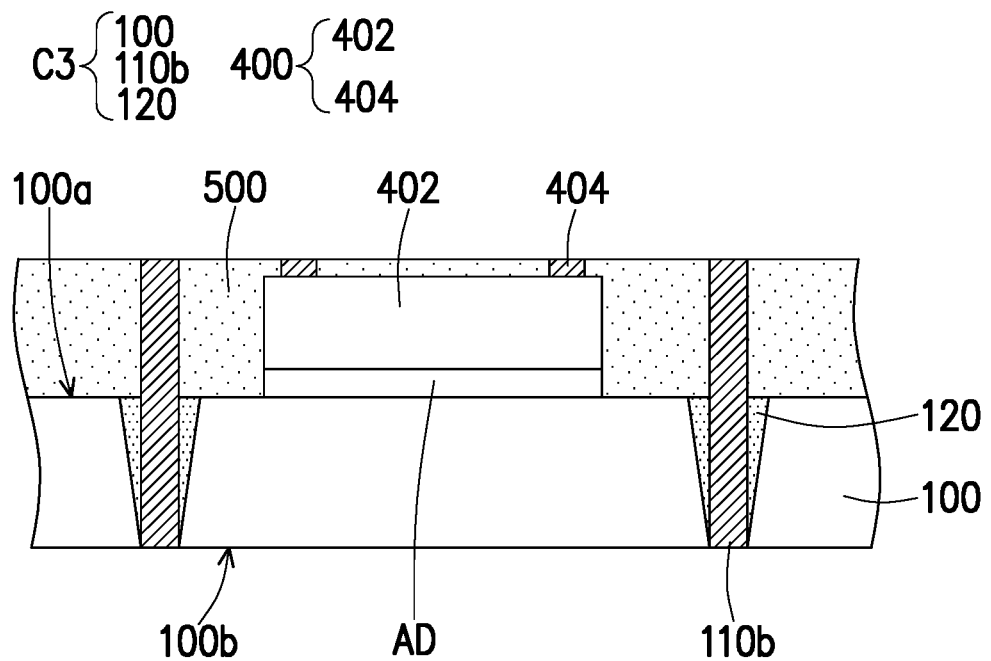

Referring to FIG. 13B, an encapsulant 500 is formed over the first surface 100a of the insulating body 100 to laterally encapsulate the die 400 and the protruding portions of each TCV 110b. That is, the encapsulant 500 encapsulates at least a portion of each TCV 110b (i.e. the portion of each TCV 110b that is located above the first surface 100a of the insulating body 100). In some embodiments, the formation method and the material of the encapsulant 500 in FIG. 13B are similar to the encapsulant 500 in FIG. 3C, so the detailed descriptions thereof are omitted herein. As illustrated in FIG. 13B, a first portion of the TCV 110b that is encapsulated by the encapsulant 500 and a second portion of the same TCV 110b that is encapsulated by the filling pattern 120 are integrally formed, and sidewalls of the first portion and the second portion are aligned.

Figure 13C:
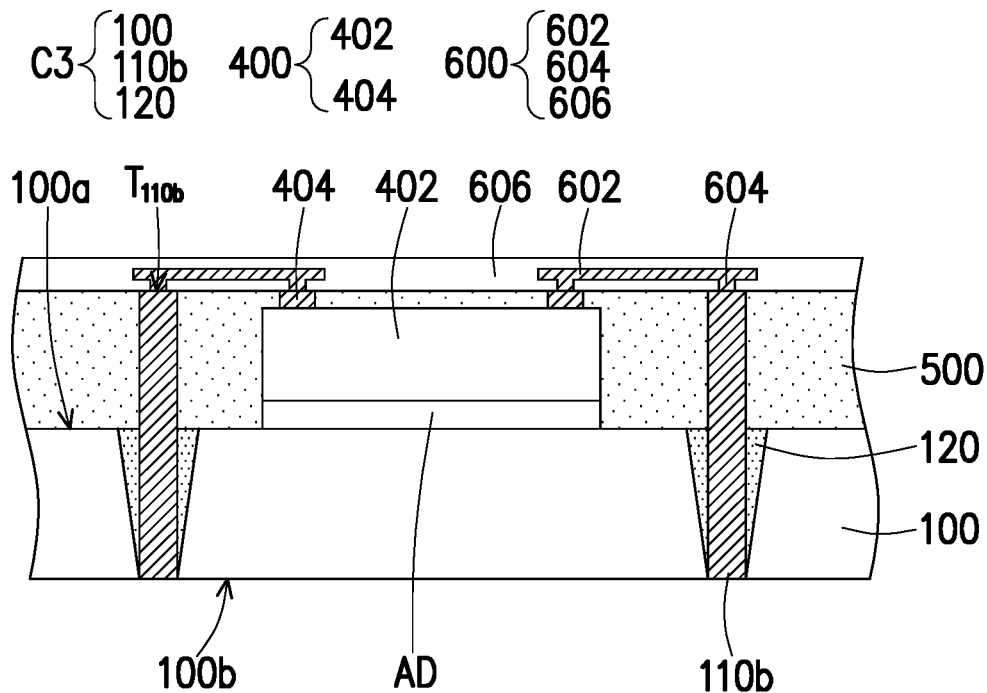

Referring to FIG. 13C, a redistribution structure 600 is formed the TCVs 110b, the die 400, and the encapsulant 500. In some embodiments, the redistribution structure 600 includes a plurality of conductive patterns 602, a plurality of conductive vias 604, and a dielectric layer 606. In some embodiments, the conductive patterns 602, the conductive vias 604, and the dielectric layer 606 in FIG. 13C are respectively similar to the conductive patterns 602, the conductive vias 604, and the dielectric layer 606 in FIG. 3D, so the detailed descriptions thereof are omitted herein. As illustrated in FIG. 13C, the conductive vias 604 are in physical contact with the TCVs 110b and the conductive posts 404 of the die 400. In other words, the conductive vias 604 render electrical connection between the redistribution structure 600 and the TCVs 110b and between the redistribution structure 600 and the die 400. In some embodiments, the die 400 is electrically connected to the TCVs 110b of the carrier substrate C3 through the redistribution structure 600.

Figure 13D:
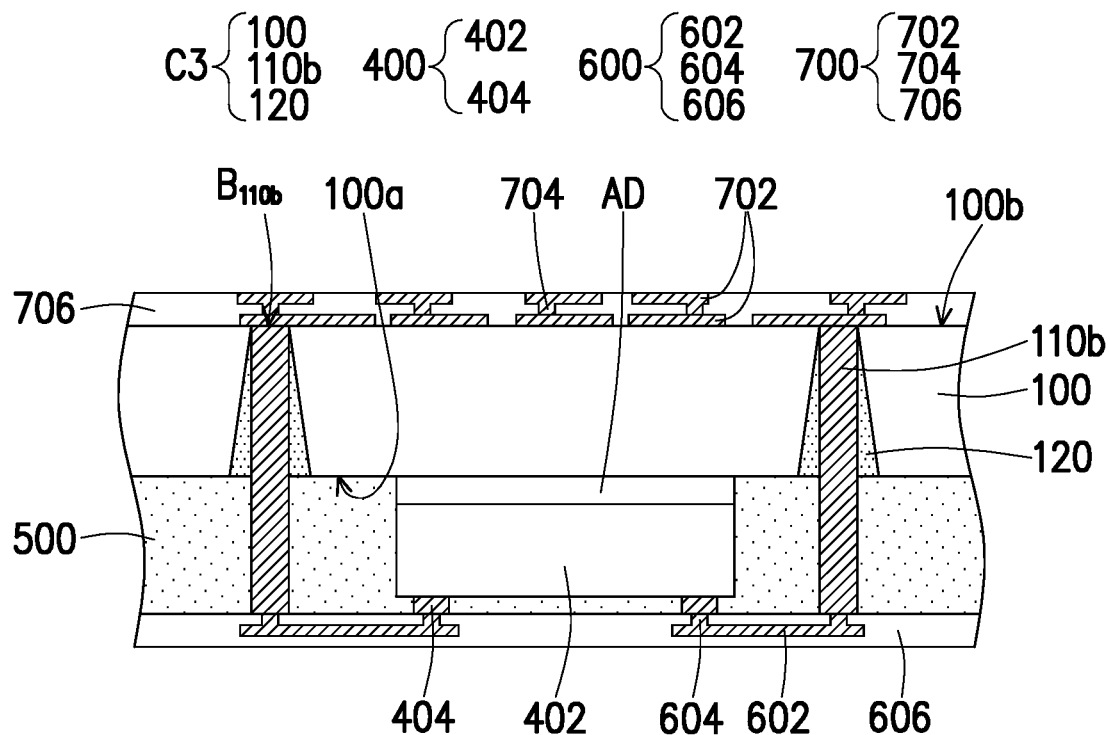

Referring to FIG. 13C and FIG. 13D, the structure illustrated in FIG. 13C is flipped upside down such that the second surface 100b of the insulating body 100 faces upward. Thereafter, a redistribution structure 700 is formed on a side of the carrier substrate C3. For example, the redistribution structure 700 is formed on the second surface 110b of the insulating body 100 and the bottom surfaces $B_{110b}$ of the TCVs 110b. In some embodiments, the redistribution structure 700 includes a plurality of conductive patterns 702, a plurality of conductive vias 704, and a dielectric layer 706. In some embodiments, the conductive patterns 702, the conductive vias 704, and the dielectric layer 706 in FIG. 13D are respectively similar to the conductive patterns 702, the conductive vias 704, and the dielectric layer 706 in FIG. 3E, so the detailed descriptions thereof are omitted herein. As illustrated in FIG. 13D, the bottommost conductive patterns 702 are in physical contact with the bottom surface $B_{110b}$ of the TCVs 110b. In other words, the redistribution structure 700 is electrically connected to the TCVs 110b through the bottommost conductive patterns 702. In some embodiments, the dielectric layer 706 exposes the topmost conductive patterns 702.

Figure 13E:
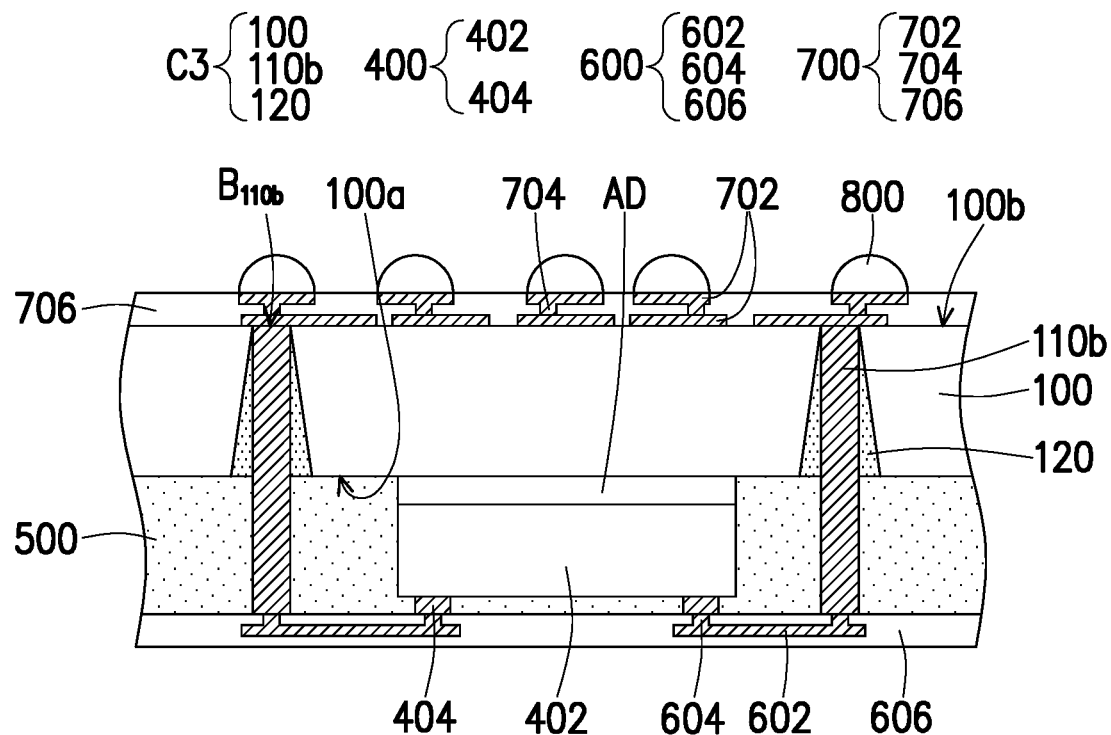

Referring to FIG. 13E, a plurality of conductive terminals 800 is formed on the redistribution structure 700. In some embodiments, the conductive terminals 800 in FIG. 13E are similar to the conductive terminals 800 in FIG. 3F, so the detailed descriptions thereof are omitted herein.

Figure 13F:
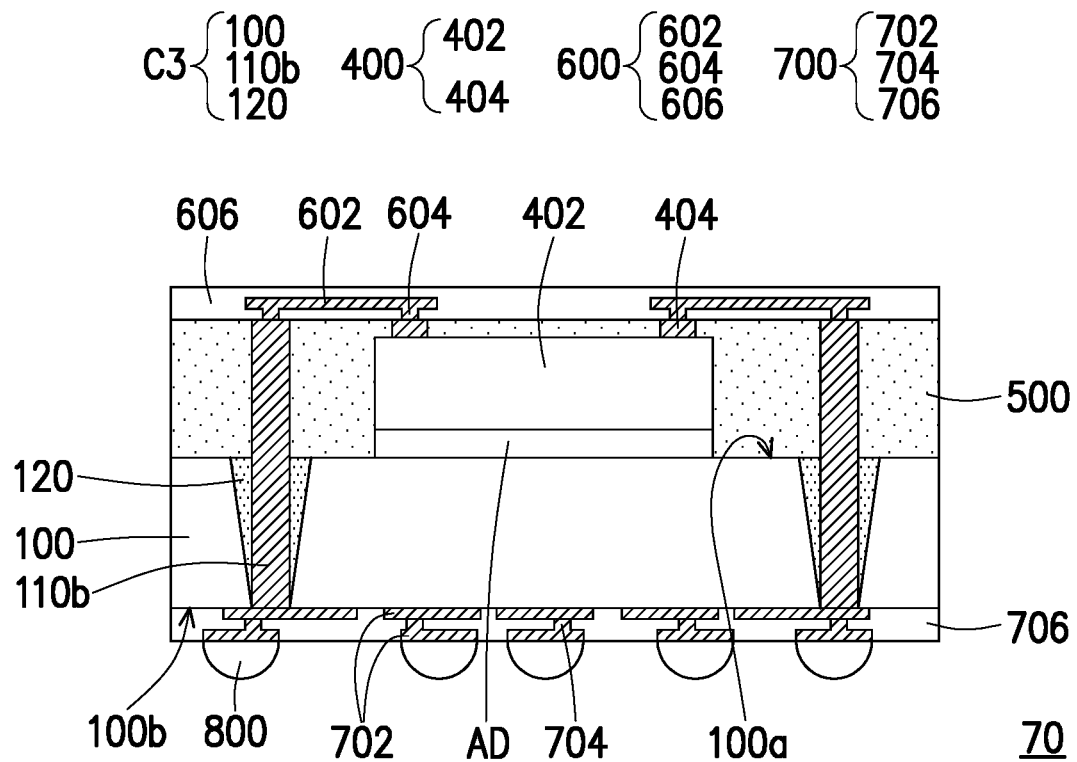

Referring to FIG. 13E and FIG. 13F, the structure illustrated in FIG. 13E is flipped upside down and a singulation process is performed on the structure to obtain a package structure 70. In some embodiments, the singulation process typically involves dicing with a rotation blade and/or a laser beam. In other words, the singulation process includes a laser cutting process, a mechanical cutting process, a laser grooving process, other suitable processes, or a combination thereof. In some embodiments, by incorporating the carrier substrate C3 having protruding TCVs 110b into the package structure 70, the conventional step of forming through insulating vias (TIV) may be omitted. As such, the manufacturing cost and the process complexity for forming the package structure 70 may be reduced.

Figure 14:
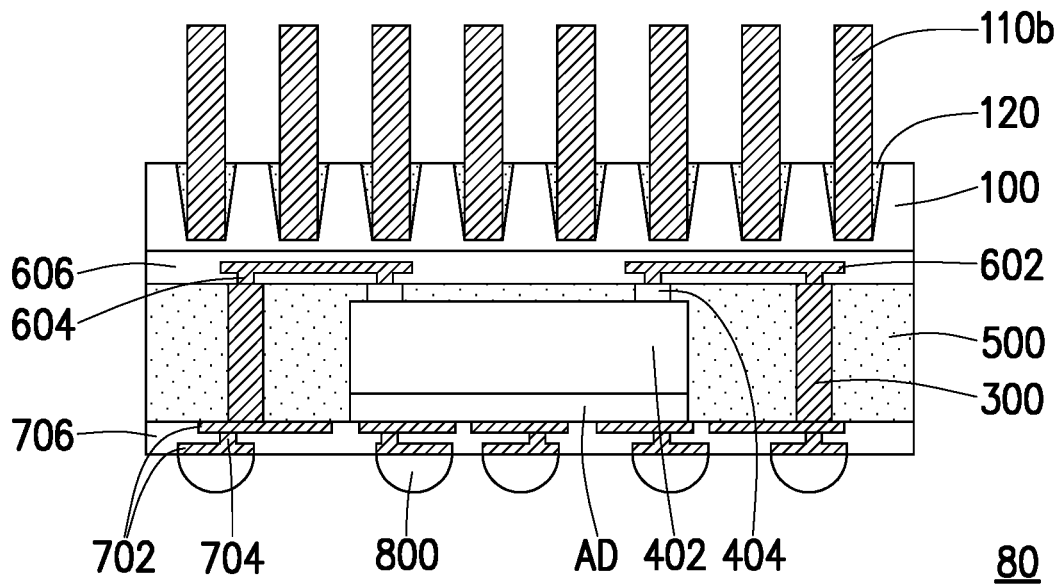
FIG. 14 is a schematic cross-sectional view illustrating a package structure in accordance with some alternative embodiments of the disclosure.

FIG. 14 is a schematic cross-sectional view illustrating a package structure 80 in accordance with some alternative embodiments of the disclosure. Referring to FIG. 14, the package structure 80 includes a carrier substrate C3, a plurality of TIVs 300, a die 400, an encapsulant 500, a redistribution structure 600, a redistribution structure 700, a plurality of conductive terminals 800, and an adhesive layer AD. That is, the carrier substrate C3 in FIG. 12E is incorporated into the package structure 80 of FIG. 14. In some embodiments, the carrier substrate C3, the TIVs 300, the die 400, the encapsulant 500, the redistribution structure 600, the redistribution structure 700, the conductive terminals 800, and the adhesive layer AD in FIG. 14 are respectively similar to the carrier substrate C3, the TIVs 300, the die 400, the encapsulant 500, the redistribution structure 600, the redistribution structure 700, the conductive terminals 800, and the adhesive layer AD in FIG. 3G, so the detailed descriptions thereof are omitted herein.

As illustrated in FIG. 14, the carrier substrate C3 is disposed on one side of the redistribution structure 600. On the other hand, the TIVs 300, the die 400, the encapsulant 500, the redistribution structure 700, the conductive terminals 800, and the adhesive layer AD are disposed on another side of the redistribution structure 600. In some embodiments, the TCVs 110b are electrically insulated from the TIVs 300, the die 400, the redistribution structure 600, the redistribution structure 700, and the conductive terminals 800. In some embodiments, the carrier substrate C3 serves as a heat exchanger. For example, the TCVs 110b serve as thermal dissipation fins for transferring the heat from inside of the package structure 80 to outside of the package structure 80.

Figure 15:
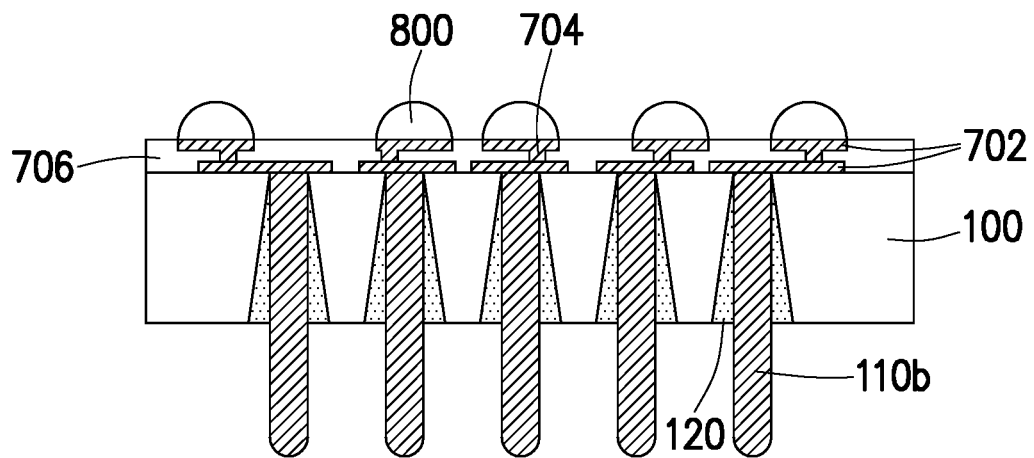
FIG. 15 is a schematic cross-sectional view illustrating a probe card in accordance with some alternative embodiments of the disclosure.

FIG. 15 is a schematic cross-sectional view illustrating a probe card 90 in accordance with some alternative embodiments of the disclosure. Referring to FIG. 15, the probe card 90 includes a carrier substrate C3, a redistribution structure 700, and a plurality of conductive terminals 800. That is, the carrier substrate C3 in FIG. 12E is incorporated into the probe card 90 of FIG. 15. In some embodiments, the carrier substrate C3, the redistribution structure 700, and the conductive terminals 800 in FIG. 15 are respectively similar to the carrier substrate C3, the redistribution structure 700, and the conductive terminals 800 in FIG. 3G, so the detailed descriptions thereof are omitted herein. As illustrated in FIG. 15, the TCVs 110b of the carrier substrate C3 are electrically connected to the redistribution structure 700 and the conductive terminals 800. As illustrated in FIG. 15, the TCVs 110b have round tips. However, the disclosure is not limited thereto. In some alternative embodiments, the TCVs 110b may have sharp tips or flat tips. In some embodiments, the TCVs 110b serve as probes of the probe card 90 to perform electrical test on other electronic devices.

In accordance with some embodiments of the disclosure, a package structure includes a carrier substrate, a die, and a first redistribution structure. The carrier substrate has a first surface and a second surface opposite to the first surface. The carrier substrate includes an insulating body and through carrier vias (TCV) embedded in the insulating body. The die is disposed over the first surface of the carrier substrate. The die is electrically connected to the TCVs. The first redistribution structure is disposed on the second surface of the carrier substrate.

In accordance with some alternative embodiments of the disclosure, a package structure includes a carrier substrate, a die, and a redistribution structure. The carrier substrate includes an insulating body and through carrier vias (TCV) partially located in the insulating body. A height of each TCV is larger than a thickness of the insulating body. The die is disposed over the carrier substrate. The redistribution structure is disposed on at least one side of the carrier substrate.

In accordance with some embodiments of the disclosure, a manufacturing method of a package structure includes at least the following steps. A carrier substrate having a first surface and a second surface opposite to the first surface is provided. A die is placed over the first surface of the carrier substrate. The die is laterally encapsulated by an encapsulant. A redistribution structure is formed on the second surface of the carrier substrate. The carrier substrate is provided by at least the following steps. An insulating body having openings therein is provided. Through carrier vias (TCV) are formed in the openings.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
a carrier substrate having a first surface and a second surface opposite to the first surface, wherein the carrier substrate comprises an insulating body and through carrier vias (TCV) embedded in the insulating body;
a die disposed over the first surface of the carrier substrate, wherein the die has an active surface and a rear surface opposite to the active surface, the die has conductive posts formed on the active surface, the active surface faces away from the insulating body, and the die is electrically connected to the TCVs; and
a first redistribution structure disposed on the second surface of the carrier substrate.

2. The package structure of claim 1, further comprising:
an encapsulant laterally encapsulating the die; and
a second redistribution structure over the encapsulant and the die.

3. The package structure of claim 2, wherein the insulating body has a cavity, the die and the encapsulant are located within the cavity, and the die is electrically connected to the TCVs through the second redistribution structure.

4. The package structure of claim 2, further comprising through insulating vias (TIV) penetrating through the encapsulant, wherein the die is electrically connected to the TCVs through the second redistribution structure and the TIVs.

5. The package structure of claim 1, wherein each TCV comprises a seed layer and a conductive layer disposed on the seed layer, and the seed layer is in physical contact with the insulating body.

6. The package structure of claim 1, wherein each TCV has a slanted sidewall.

7. The package structure of claim 1, wherein each TCV has a substantially straight sidewall.

8. The package structure of claim 7, wherein the carrier substrate further comprises filling patterns sandwiched between each TCV and the insulating body.

9. The package structure of claim 8, wherein each filling pattern has an inner sidewall contacting the corresponding TCV and an outer sidewall contacting the insulating body, the inner sidewall of each filling pattern is substantially straight, and the outer sidewall of each filling pattern is slanted.

10. The package structure of claim 8, wherein a Young's modulus of the filling pattern ranges from about 3 GPa to about 30 GPa.

11. A package structure, comprising:
- a carrier substrate, wherein the carrier substrate comprises an insulating body and through carrier vias (TCV) partially located in the insulating body, wherein a height of each TCV is larger than a thickness of the insulating body;
- a die disposed over the carrier substrate, wherein the die has an active surface and a rear surface opposite to the active surface, the die has conductive posts formed on the active surface, and the active surface faces away from the insulating body; and
- a redistribution structure disposed on at least one side of the carrier substrate.

12. The package structure of claim 11, wherein the carrier substrate further comprises filling patterns sandwiched between each TCV and the insulating body.

13. The package structure of claim 11, wherein each TCV has a substantially straight sidewall.

14. The package structure of claim 11, further comprising an encapsulant laterally encapsulating the die.

15. The package structure of claim 14, wherein the encapsulant further encapsulates at least a portion of each TCV.

16. A manufacturing method of a package structure, comprising:
- providing a carrier substrate having a first surface and a second surface opposite to the first surface, comprising:
  - providing an insulating body having openings therein; and
  - forming through carrier vias (TCV) in the openings;
- placing a die over the first surface of the carrier substrate, wherein the die has an active surface and a rear surface opposite to the active surface, the die has conductive posts formed on the active surface, and the active surface faces away from the insulating body;
- laterally encapsulating the die by an encapsulant; and
- forming a redistribution structure on the second surface of the carrier substrate.

17. The method of claim 16, wherein forming the TCVs in the openings comprises:
- forming a seed material layer over the insulating body and within the openings, wherein the seed material layer is in physical contact with the insulating body;
- forming a conductive material layer over the seed material layer; and
- removing a portion of the conductive material layer and a portion of the seed material layer until the insulating body is exposed to form a seed layer and a conductive layer within the openings.

18. The method of claim 16, wherein forming the TCVs in the openings comprises:
- placing pre-fabricated TCVs into the openings of the insulating body.

19. The method of claim 18, wherein providing the carrier substrate further comprises forming filling patterns in the openings of the insulating body, wherein the filling patterns are sandwiched between each TCV and the insulating body.

20. The method of claim 16, further comprising:
- forming a cavity in the insulating body, wherein a depth of the cavity is smaller than a depth of each opening, and the die and the encapsulant are formed within the cavity.

* * * * *